United States Patent [19]
Kaifu et al.

[11] Patent Number: 5,812,109
[45] Date of Patent: Sep. 22, 1998

[54] IMAGE INPUT/OUTPUT APPARATUS

[75] Inventors: Noriyuki Kaifu, Hachioji; Hidemasa Mizutani, Sagamihara; Shinichi Takeda; Isao Kobayashi, both of Atsugi, all of Japan

[73] Assignee: Canon Kabushiki Kaisha, Tokyo, Japan

[21] Appl. No.: 512,700

[22] Filed: Aug. 8, 1995

[30] Foreign Application Priority Data

| Aug. 23, 1994 | [JP] | Japan | 6-198282 |
| Aug. 23, 1994 | [JP] | Japan | 6-198283 |

[51] Int. Cl.$^6$ ............................................. G06F 3/033
[52] U.S. Cl. ........................................................ 345/104
[58] Field of Search ...................... 345/104; 250/208.1; 348/207; 349/42

[56] References Cited

U.S. PATENT DOCUMENTS

| 4,534,622 | 8/1985 | Harada et al. | 350/334 |
| 4,745,488 | 5/1988 | Kaifu et al. | 358/294 |
| 4,926,058 | 5/1990 | Iwamoto et al. | 250/578.1 |
| 5,054,892 | 10/1991 | Takanashi et al. | 349/30 |
| 5,060,040 | 10/1991 | Saika et al. | 357/30 |
| 5,233,442 | 8/1993 | Kawai et al. | 358/482 |
| 5,272,548 | 12/1993 | Kawai et al. | 358/482 |
| 5,311,038 | 5/1994 | Yamamoto et al. | 257/40 |
| 5,313,055 | 5/1994 | Shiratsuki et al. | 250/208.1 |
| 5,317,406 | 5/1994 | Kobayashi et al. | 348/307 |
| 5,335,094 | 8/1994 | Kaifu et al. | 358/494 |
| 5,430,462 | 7/1995 | Katagiri et al. | 345/104 |
| 5,432,333 | 7/1995 | Rostoker et al. | 250/208.1 |
| 5,446,564 | 8/1995 | Mawatari et al. | 349/116 |
| 5,467,204 | 11/1995 | Hatano et al. | 358/482 |
| 5,541,748 | 7/1996 | Ono et al. | 349/42 |
| 5,585,817 | 12/1996 | Itoh et al. | 345/104 |
| 5,591,963 | 1/1997 | Takida et al. | 250/214.1 |

FOREIGN PATENT DOCUMENTS

| 0117957 | 9/1984 | European Pat. Off. . |
| 0178190 | 4/1986 | European Pat. Off. . |
| 59-158553 | 9/1984 | Japan . |
| 62-198155 | 9/1987 | Japan . |
| 4-80791 | 3/1992 | Japan . |
| 4282609 | 10/1992 | Japan . |
| 5-90557 | 4/1993 | Japan . |
| 5244346 | 9/1993 | Japan . |
| WO 9410793 | 5/1994 | WIPO . |

OTHER PUBLICATIONS

IEEE 34th Electronic Components Conference, 14 May 1984 Hyatt Regency Hotel, New Orleans, Louisiana, USA, pp. 264–268, M. Sakamoto et al.
'High Speed and High Resolution ISO A4 Size Amorphous SI:H Contact Linear Image Sensor'* the whole document *.
Patent Abstracts of Japan, vol. 14 No. 182 (E–916), 12 Apr. 1990 & JP–A–02 033253 (Kadetsuto KK) * Abstract *.
Patent Abstracts of Japan, vol. 17 No. 710 (E–1484), 24 Dec. 1993 & JP–A–05 244346 (NEC Corp) * Abstract *.

*Primary Examiner*—Mark R. Powell
*Attorney, Agent, or Firm*—Fitzpatrick,Cella, Harper & Scinto

[57] ABSTRACT

An image input/output apparatus has a photoelectric conversion element, a display element, and a switch element on a substrate, and has a function of displaying an image using the display element by holding a display potential supplied via the switch element in the photoelectric conversion element, and a function of picking up an image by detecting a charge generated in response to light incident on the photoelectric conversion element via the switch element. The photoelectric conversion element is constituted by a first electrode layer, an insulating layer for preventing passage of a carrier of a first conductivity type and a carrier of a second conductivity type different from the first conductivity type, a photoelectric conversion semiconductor layer, an injection prevention layer for preventing injection of the carrier of the first conductivity type to the photoelectric conversion layer, and a second electrode layer. The image input/output apparatus does not require any complicated structure for shielding light, has good display and image pickup characteristics, and allows easy manufacturing processes with low cost.

26 Claims, 14 Drawing Sheets

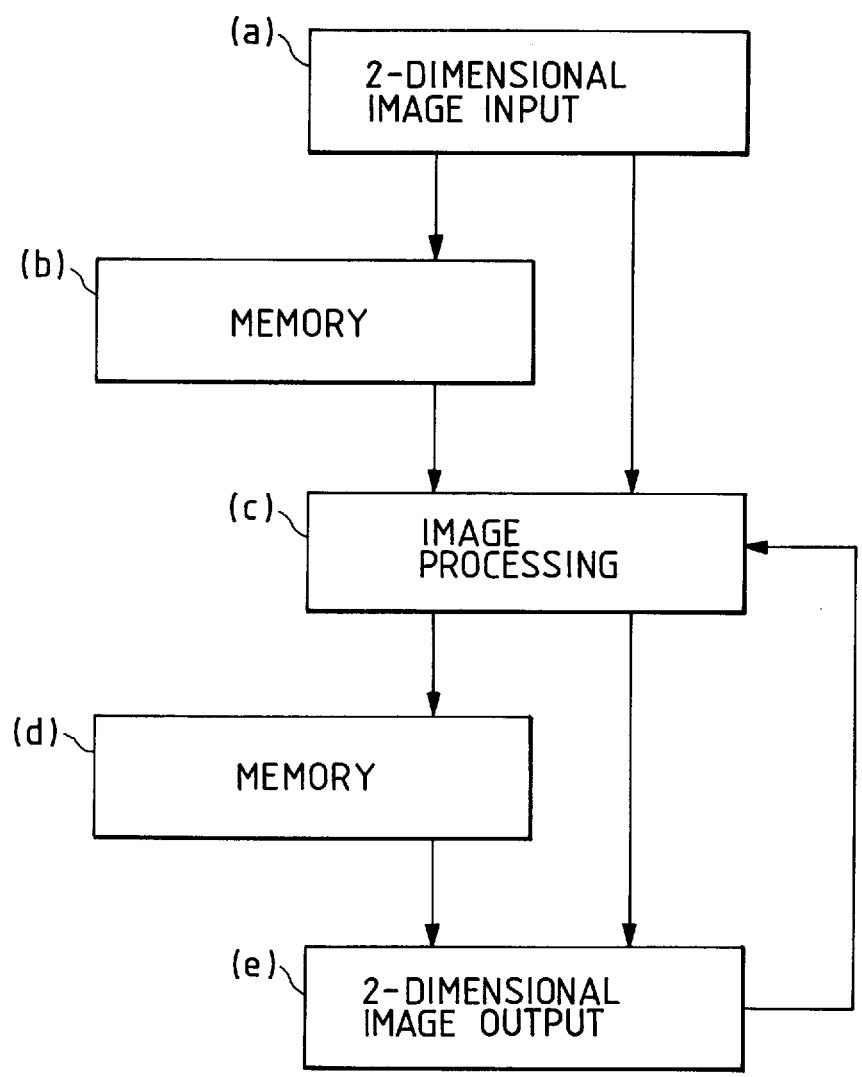

IMAGE INPUT/OUTPUT APPARATUS

BACKGROUND OF THE INVENTION

1. Field of the Invention

The present invention relates to an image input/output apparatus having two functions, i.e., image pickup and display functions.

2. Related Background Art

Conventionally, various kinds of apparatuses having an independent image pickup or display function such as an image pickup apparatus (e.g., a CCD camera) and a display apparatus (e.g., a CRT display, a liquid crystal display, or the like) have been put into practical applications. However, no apparatus having both an image pickup function and a display function in a composite manner is commercially available. An apparatus such as a video cam corder which can display an object which is being picked up or was picked up is available. However, in this apparatus, an image pickup device and a display device are merely mounted in a single housing, and its function cannot be called a composite function. In addition, the cost of this apparatus cannot be lower than the sum of the costs of the two devices. A single apparatus which combines, e.g., an image pickup function and a display function in a compound manner can have a size smaller than that of a simple combination of the two devices, and cost lower than a sum of the costs of the two devices. For this reason, such an apparatus is expected to be put into a practical application, and various proposals have been made in recent years.

For example, Japanese Laid-Open Patent Application No. 59-158553 discloses an apparatus which has a large number of arrays of liquid crystal display portions, image pickup portions, and switch portions, which are arranged on a transparent substrate in units of pixels, thus realizing an apparatus which achieves display and image pickup functions in a compound manner by a single panel.

FIG. 1A is an equivalent circuit diagram for explaining the arrangement per pixel of a solid-state image pickup apparatus having these two functions. A gate 12 of a switch element 11 is connected to an address line 13, and its source 14 is connected to a data line 15. A drain 16 of the switch element 11 is connected to the electrode of a liquid crystal display element 17 and the electrode of a photoelectric conversion element 18. One electrode of the liquid crystal element 17 is maintained at a constant potential, and displays of "white", "black, and the like are attained by the potential difference between the electrodes. FIG. 1B shows the film structure of the photoelectric conversion element 18. A transparent electrode 2, a high-resistance photoconductive film 4, an ohmic layer 5, and an upper electrode 6 are stacked in turn on a transparent insulating substrate 1. In a dark state without incidence of any light, the high-resistance photoconductive film 4 of the photoelectric conversion element 18 serves as a simple dielectric member, and the photoelectric conversion element 18 serves as a capacitor. On the contrary, when light is incident on the high-resistance photoconductive film 4 via the transparent insulating substrate 1 and the transparent electrode 2, the photoelectric conversion element 18 serves as a capacitor, and at the same time, a charge formed in the film and proportional to the amount of incident light moves to the transparent electrode 2 and the upper electrode 6, thus changing the potentials of these electrodes.

The image pickup and display operations will be described below with reference to FIG. 1A showing the equivalent circuit per pixel. When an image pickup operation is performed, the switch element 11 is turned on by selecting the address line 13, and applies an initial potential to the terminal, P, of the photoelectric conversion element 18. Thereafter, the switch element 11 is turned off for an arbitrary period of time to electrically set the terminal P in the floating state. The potential of the terminal P changes in correspondence with the amount of light incident on the photoelectric conversion element 18 in this state, and the changed potential or the movement of a charge upon re-initialization is detected when the switch element 11 is turned on again. When a display operation is to be performed, the photoelectric conversion element 18 is set in a state wherein no light is incident thereon, and the switch element 11 is turned on by selecting the address line 13, and a potential corresponding to the display contents is applied to the terminal P of the liquid crystal display element 17 via the data line 15. Thus, the liquid crystal display element 17 performs the display operation. At this time, the photoelectric conversion element 18 serves as a holding capacitor, and holds the potential of the terminal P after the switch element 11 is turned off.

However, with the above-mentioned prior art, it is very difficult to manufacture a solid-state image pickup/display apparatus with good display characteristics and low cost. The reasons for this difficulty will be explained below.

First, the displayed image is disturbed when light is incident on the photoelectric conversion element 18 during an image display operation. In order to observe the displayed image, light must be incident on the liquid crystal display element 17. However, light also becomes incident on the photoelectric conversion element 18 formed near the element 17. Even when a light-shielding layer or the like is formed, light is incident on the element 18 albeit slightly by reflection or diffusion at the interfaces and surfaces of the transparent insulating substrate 1 and the transparent electrode 2. If light is incident on the photoelectric conversion element 18 during a display operation, the potential of the terminal P changes even when the switch element 11 is kept OFF, and the display is disturbed by this light. When a complicated element arrangement or optical system is adopted to eliminate such incident light, this leads to a low yield or cost hike in the manufacturing process. Even when incident light can be perfectly eliminated, a charge may be thermally generated in the high-resistance photoconductive film 4, and change the potential of the terminal P, thus deteriorating the displayed image quality.

Second, the photoelectric conversion element 18 and the switch element 11 shown in FIGS. 1A and 1B cannot be formed in a single process to have the same film structure. No switch element which has the same film structure as that shown in FIG. 1B and good switch characteristics has been reported, and such a switch element normally requires a gate insulating film between an electrode serving as a gate and a semiconductor layer serving as a channel. Since the photoelectric conversion element 18 shown in FIG. 1B does not have this insulating film, when the element 18 and the switch element 11 are to be formed on a single substrate, film formation and etching processes in units of elements are required, resulting in a complicated manufacturing process and a high cost.

In addition to the above-mentioned apparatus, as a portable image input/output apparatus, a combination of an image input device such as a one-dimensional handy scanner, a one-dimensional image reader, or the like and an image output device such as a liquid crystal display is known. However, in such a portable image input/output apparatus, a user who operates the scanner as the image input device must move an image input unit (normally, a photoelectric conversion unit) along an original or must mechanically scan the image input unit relative to an original. For this reason, a reading error occurs due to an improper scanning speed, resulting in poor operability, and a large device to be scanned. In addition, since the scanner is required in addition to the display device, the structure is complicated and it is difficult to realize a compact, lightweight structure, thus posing problems associated with high cost and low portability.

In order to solve these problems, a method of attaining an original reading operation and an image display operation on a single surface by stacking a two-dimensional image display device and an image output device such as a two-dimensional liquid crystal display is proposed.

For example, in a technique disclosed in Japanese Laid-Open Patent Application No. 4-282609, an image output liquid crystal display board, which has liquid crystal elements and TFT elements for driving the liquid crystal elements on a transparent substrate, is stacked on an image sensor board, which has an image input image sensor on a transparent substrate.

On the other hand, Japanese Laid-Open Patent Application No. 5-244346 discloses a technique wherein an image sensor board is stacked on a liquid crystal display board.

However, in these two techniques, devices having functions of an image sensor as an image input device and a liquid crystal display as an image output (display) device are stacked as independent devices, and there is room for improvement to attain a further compact, lightweight structure of an image input/output apparatus.

In the sense that an image input operation is performed, a handwriting input device is also an image input device.

As an apparatus which uses such a handwriting input method, an apparatus utilizing an image input method disclosed in Japanese Laid-Open Patent Application No. 4-80791 is known.

Japanese Laid-Open Patent Application No. 4-80791 discloses an apparatus which comprises a coordinate input substrate for detecting the coordinate position of an input point on the basis of the pen pressure of an input pen or the like in place of an image sensor for inputting an image, as shown in FIG. 2. With this arrangement, no coordinate input surface independent from the image output surface is required, and the size and cost reductions of the entire apparatus can be realized.

However, in the image input/output apparatus comprising the coordinate input substrate for detecting coordinate positions on the basis of the pen pressure of, e.g., an input pen, as shown in FIG. 2, the reading resolution of the coordinate input substrate for detecting the coordinate position is lower than the number of pixels of the image output unit, resulting in poor input precision.

Also, in the image input/output apparatus comprising the coordinate input substrate for detecting coordinate positions on the basis of the pen pressure of, e.g., an input pen, as shown in FIG. 2, certain types of existing originals cannot be read.

SUMMARY OF THE INVENTION

It is an object of the present invention to provide an image input/output apparatus which has both an image input function and an image output function, and in which a portion of an image input unit constitutes a portion of an image output unit (or vice versa).

That is, it is another object of the present invention to provide an image input/output apparatus which has an image input function and an image output function in a composite manner.

It is still another object of the present invention to provide an image input/output apparatus which is suitable for size and weight reductions, and can attain low cost.

It is still another object of the present invention to provide an image input/output apparatus which has good display characteristics (output characteristics) and good input performance.

It is still another object of the present invention to provide an image input/output apparatus which can simplify the manufacturing process by forming elements to be formed in both image input and output units in common main processes in place of forming these elements in independent processes in units of elements of the two units, and can attain high yield and low cost.

It is still another object of the present invention to provide an image input/output apparatus which has good input/output characteristics by providing good capacitor characteristics to a photoelectric conversion element.

Furthermore, it is still another object of the present invention to provide an image input/output apparatus which comprises a photoelectric conversion element having good capacitor characteristics even when light is incident on the photoelectric conversion element during an image output (display) operation.

It is still another object of the present invention to provide an image input/output apparatus which comprises an image input unit having a photoelectric conversion element and an image output unit, wherein the image input unit has a photoelectric conversion element comprising at least a first electrode layer, an insulating layer for preventing passage of a carrier of a first conductivity type and a carrier of a second conductivity type different from the first conductivity type, a photoelectric conversion semiconductor layer, a second electrode layer, and an injection prevention layer formed between the second electrode layer and the photoelectric conversion semiconductor layer to prevent injection of the carrier of the first conductivity type to the photoelectric conversion semiconductor layer, which are formed on a first substrate, and the image output unit has a display element which uses the second electrode layer as one electrode and has a counter electrode formed to face the second electrode layer, and the counter electrode is formed on a second substrate disposed to face the first substrate.

In addition, it is still another object of the present invention to provide an image input/output apparatus, which comprises an input/output unit realized by integrating an image input unit for inputting an image and an image output unit for displaying an image, and a cover for covering the input/output unit, and has a recording surface provided in correspondence with the input/output unit of the cover.

BRIEF DESCRIPTION OF THE DRAWINGS

FIG. 9 is a flow chart for explaining the operation of the image input/output apparatus of the present invention;

DETAILED DESCRIPTION OF THE PREFERRED EMBODIMENTS

The present invention will be described in detail hereinafter with reference to the accompanying drawings.

Figure 1A:
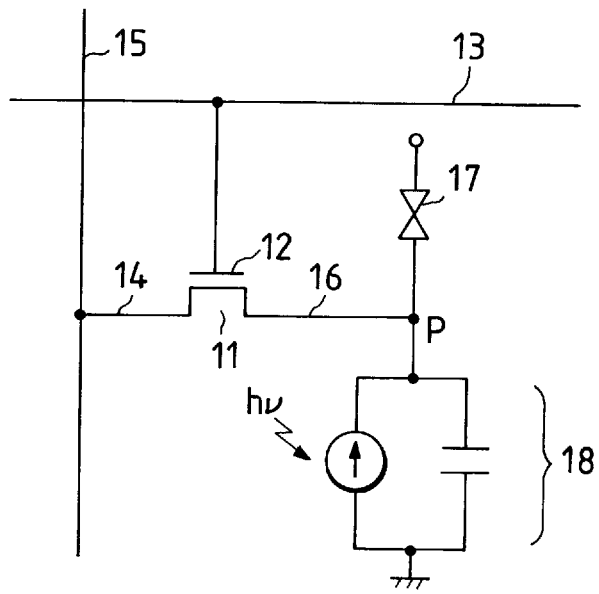
FIG. 1A is a schematic equivalent circuit diagram for explaining an example of an image input/output apparatus.
Figure 1B:
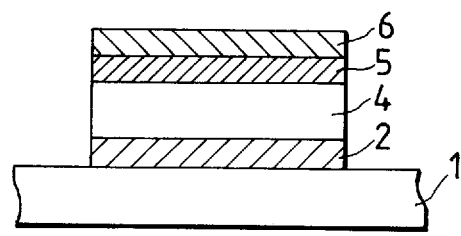
FIG. 1B is a sectional view for explaining a photoelectric conversion element shown in FIG. 1A.
Figure 2:
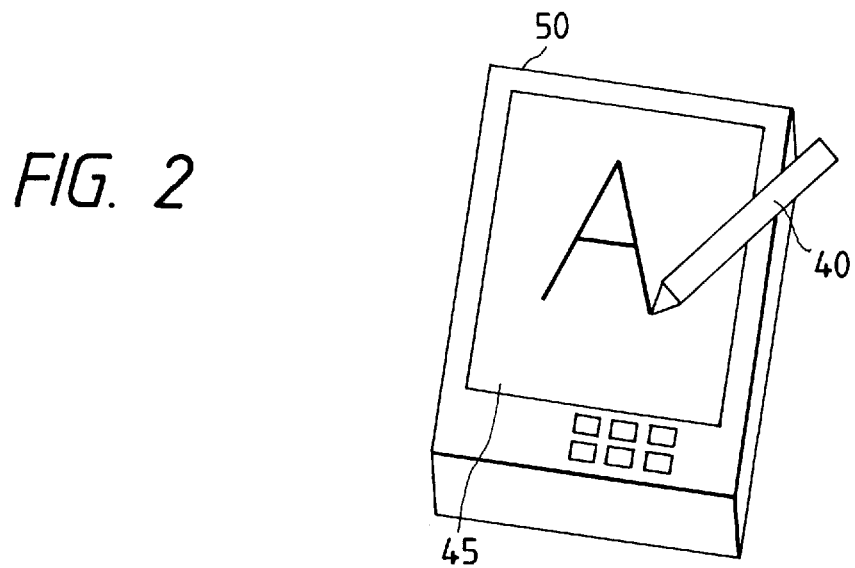
FIG. 2 is a schematic perspective view for explaining an example of a coordinate input type image input/output apparatus.
Figure 3:
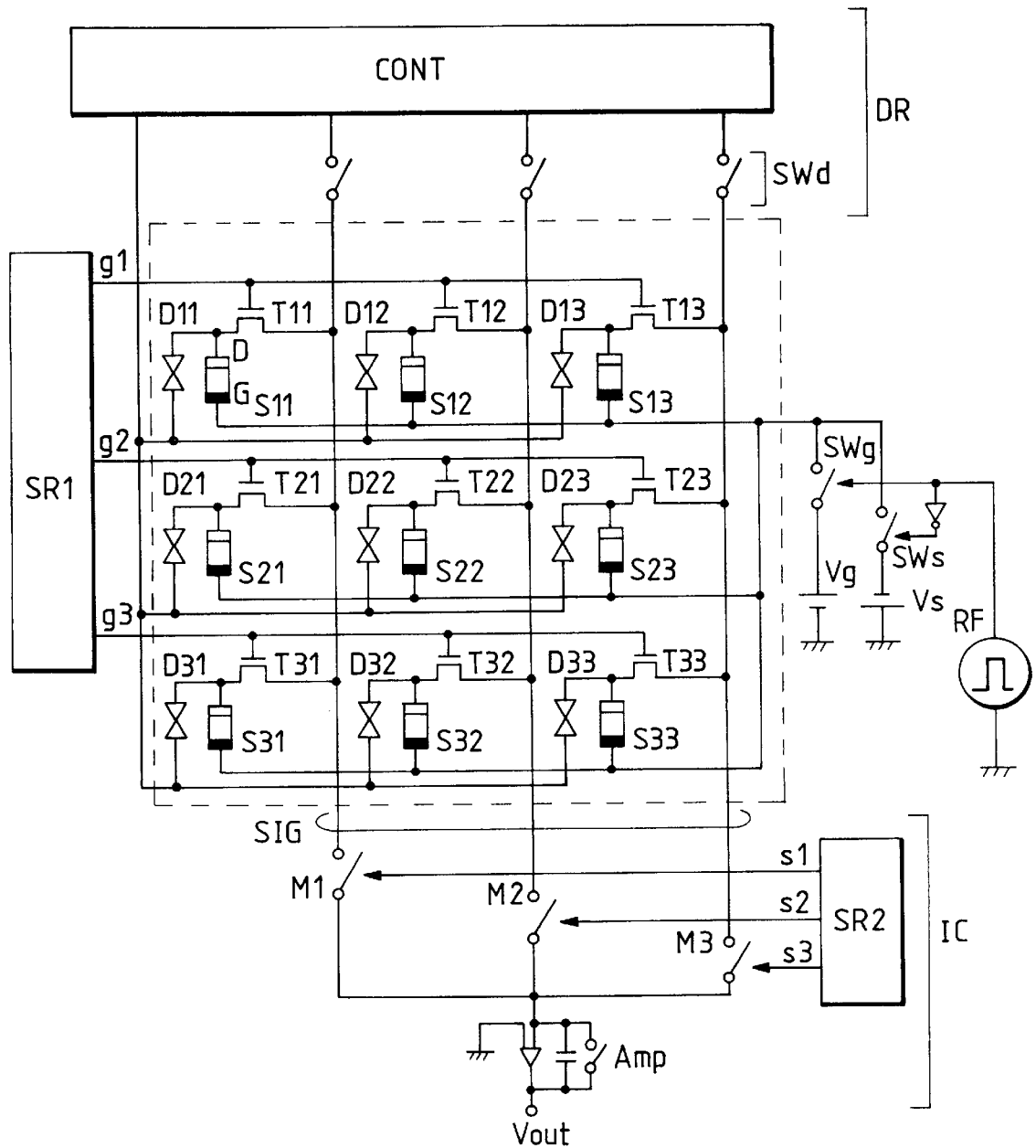
FIGS. 3 and 10 are schematic circuit diagrams respectively showing preferred embodiments of an image input/output apparatus according to the present invention.
Figure 4A:
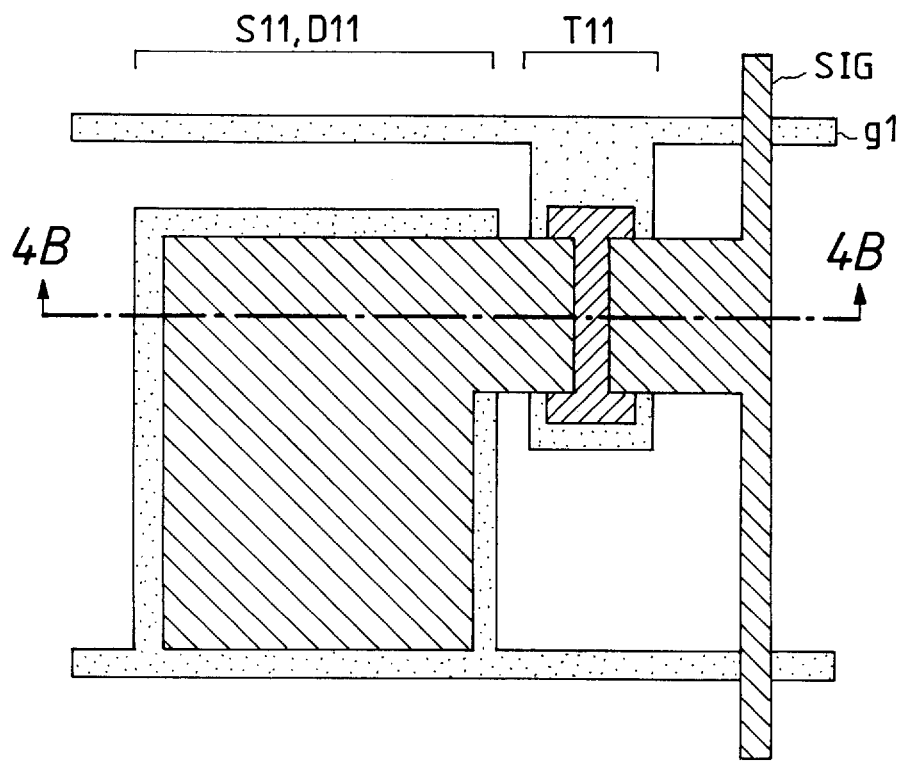
FIGS. 4A and 11A are schematic plan views for explaining the preferred embodiments of an image input unit and a portion of an image output unit of the image input/output apparatus of the present invention.
Figure 4B:
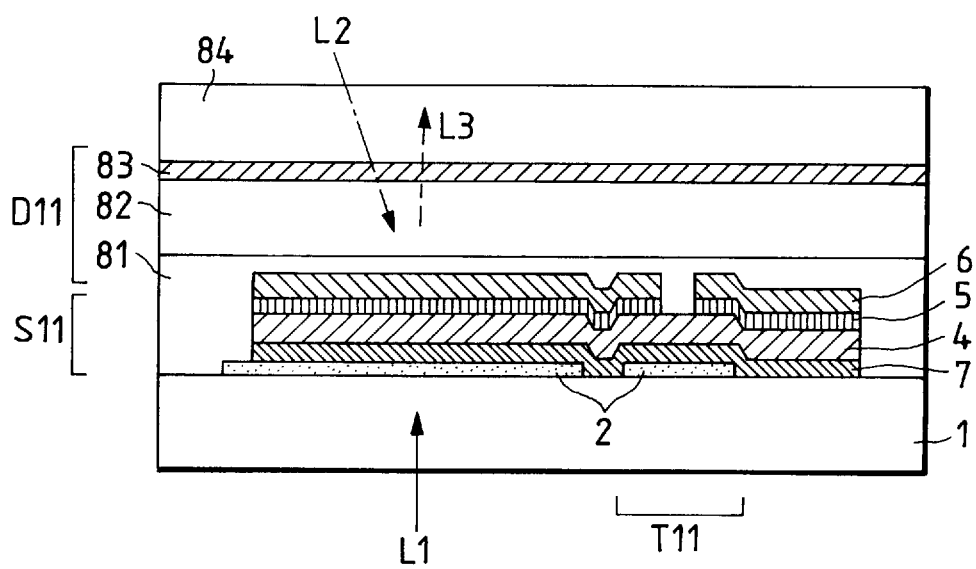
FIGS. 4B and 11B are sectional views of the preferred embodiments of the image input/output apparatus of the present invention.

FIG. 3 is a schematic circuit diagram showing the overall image input/output apparatus according to a preferred embodiment of the present invention, FIG. 4A is a schematic plan view of constituting elements corresponding to one pixel in this embodiment, and FIG. 4B is a schematic sectional view of FIG. 4A. The circuit shown in FIG. 3 includes photoelectric conversion elements S11 to S33 each having a lower electrode G and an upper electrode D. The circuit shown in FIG. 3 also includes liquid crystal display elements D11 to D33, and switch elements T11 to T33. A reading power supply Vs and a refresh power supply Vg are connected to the G electrodes of the photoelectric conversion elements S11 to S33 via switches SWs and SWg, respectively. The switch SWs is connected to a refresh control circuit RF via an inverter, and the switch SWg is directly connected to the circuit RF.

One pixel has a photoelectric conversion element, a liquid crystal display element, and a thin film transistor (to be referred to as a TFT hereinafter) as a switch element, and the signal input/output line of the circuit for one pixel is connected to a detection integrated circuit IC and a liquid crystal drive circuit DR via a signal wiring line SIG.

The image input/output apparatus shown in FIG. 3 has a total of nine pixels as an example. These pixels are divided into three blocks, and the input/output operations of three pixels of each block can be simultaneously controlled. In FIG. 3, the pixels are two-dimensionally arranged by arranging three pixels of one block in the horizontal direction in FIG. 3 and arranging three blocks in turn in the vertical direction in FIG. 3.

During an image pickup operation (image input operation), the outputs from the three pixels in one block are simultaneously transferred, and are sequentially converted into outputs by the detection integrated circuit IC via the signal wiring lines SIG. Then, these outputs are output to a terminal Vout. This operation is repeated from the first to third blocks, thus obtaining a two-dimensional image signal.

During an image display operation (image output operation), the liquid crystal drive circuit DR converts display information corresponding to three pixels in the first block into voltage signals, and transfers these signals to the corresponding pixels via the signal wiring lines SIG. These potentials are held by the photoelectric conversion elements S11 to S13. These display potentials control reflection of light in the liquid crystal display elements D11 to D13, thus displaying information. This operation is repeated from the first to third blocks, thereby displaying a two-dimensional image.

A portion surrounded by a broken line in FIG. 3 is formed on a single large-area insulating substrate. FIG. 4A is a plan view of a portion corresponding to the first pixel in the portion surrounded by the broken line in FIG. 3, and FIG. 4B is a sectional view of a portion taken along a broken line 4B—4B in FIG. 4A. The portion shown in FIGS. 4A and 4B includes the photoelectric conversion element S11, the liquid crystal display element D11, the TFT T11, the signal wiring line SIG, and a control wiring line g1. The method of forming these elements will be described in turn below.

A transparent conductive material (ITO) as the lower electrode layer 2 is deposited by sputtering on a glass substrate 1 as an insulating material to a thickness of about 500 Å, and is patterned by photolithography. Then, an unnecessary area is removed by etching. In this process, the lower electrode of the photoelectric conversion element S11, the gate electrode of the TFT T11, and the control wiring line g1 are formed.

A 2,000-Å thick SiN layer (7), a 5,000-Å thick i layer (4), and a 500-Å thick n layer (5) are deposited by CVD under the same vacuum condition. These layers respectively serve as an insulating layer, an photoelectric conversion semiconductor layer, and a hole injection prevention layer of the photoelectric conversion element S11, and as a gate insulating film, a semiconductor layer, and an ohmic contact layer of the TFT T11. On the other hand, in a cross portion of wiring lines such as the cross portion of the signal wiring line SIG and the control wiring line g1, these three layers are stacked to serve as an intermediate layer that attains insulation between the upper and lower wiring lines. The thicknesses of the respective layers are not limited to those described above, and are preferably optimally designed in correspondence with the voltage, current, charge, incident light amount, and the like to be used in a photoelectric conversion device. Of these layers, at least the SiN layer requires a thickness of 500 Å or more since it must prevent passage of electrons and holes and must also serve as the gate insulating film of the TFT.

Note that the SiN layer consists of an insulating material containing Si (silicon) and N (nitrogen), and preferably consists of a material containing one or both amorphous and crystallite materials. These materials need not always be contained at a stoichiometric ratio. The i layer is an intrinsic or substantially intrinsic semiconductor layer, and the n layer is an n-type semiconductor layer. The materials of these semiconductor layers are not particularly limited as long as they have photoconductivity, i.e., can attain photoelectric conversion, and can be used as a semiconductor for a thin film transistor. However, in consideration of easy film formation on a large-area substrate, low cost, and semiconductor characteristics, non-monocrystalline silicon containing hydrogen or halogen atoms, and more preferably, amorphous silicon and/or crystallite silicon containing hydrogen or halogen atoms may be used as a preferred material.

The i layer can consist of a semiconductor material which does not contain or substantially does not contain an impurity for controlling the conductivity type, or can be a semiconductor material which contains both an impurity capable of controlling the conductivity type to p type and an impurity capable of controlling the conductivity type to n type.

The n-type semiconductor layer preferably contains atoms such as P (phosphorus), As (arsenide), and the like, which belong to group V of the periodic table, and the p-type semiconductor layer preferably contains atoms such as B (boron), Ga (gallium), In (indium), and the like, which belong to group III of the periodic table.

After the respective layers are deposited, an area serving as a contact hole is formed by etching, and thereafter, a 10,000-Å thick Al film serving as an upper metal layer 6 is deposited. The resultant structure is patterned by photolithography, and an unnecessary area is removed by etching, thereby forming the upper electrode of the photoelectric conversion element S11, the source and drain electrodes as the main electrodes of the TFT T11, and the signal wiring line SIG. At this time, the lower and upper wiring lines are connected through the contact hole at the same time.

Furthermore, the n layer in only the channel portion of the TFT T11 is etched by RIE, and thereafter, unnecessary portions of the SiN layer (7), the i layer (4), and the n layer (5) are removed by etching, thus attaining element isolation. In this process, the photoelectric conversion element S11, the TFT T11, the signal wiring line SIG, the control wiring line g1, and the like are completed. As described above, the photoelectric conversion element and the TFT can be simultaneously formed as common films in the same process.

Thereafter, an orientation layer 81 as an insulating member, a transparent common electrode (counter electrode) 83, and an upper glass 84 are formed, and a liquid crystal layer 82 is formed by injecting a liquid crystal material, thus completing the liquid crystal display element D11. The individual electrodes of the liquid crystal display element D11 commonly use the upper electrode of the photoelectric conversion element S11. That is, a portion of the input unit constitutes a portion of the output unit (or vice versa). In FIG. 4A, the layers or members 81 to 84 of the element D11 are not shown.

In FIG. 4B, image information light L1 is indicated by a solid line, and indicates light obtained by imaging information to be obtained by a lens system or light reflected by an original when an original is in direct tight contact with the upper glass 84. When an image is to be displayed, the optical characteristics of the liquid crystal layer 82 are changed by the potential between the electrodes of the liquid crystal display elements to reflect incident light L2 as reflected light L3 or absorb or diffuse the incident light L2.

Figure 5A:
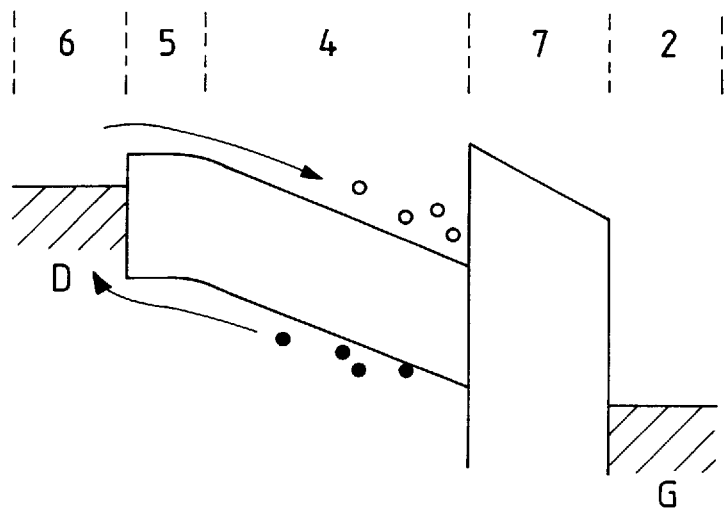
FIGS. 5A to 5C and FIGS. 6A and 6B are energy band diagrams of elements in the image input unit of the present invention.
Figure 5B:
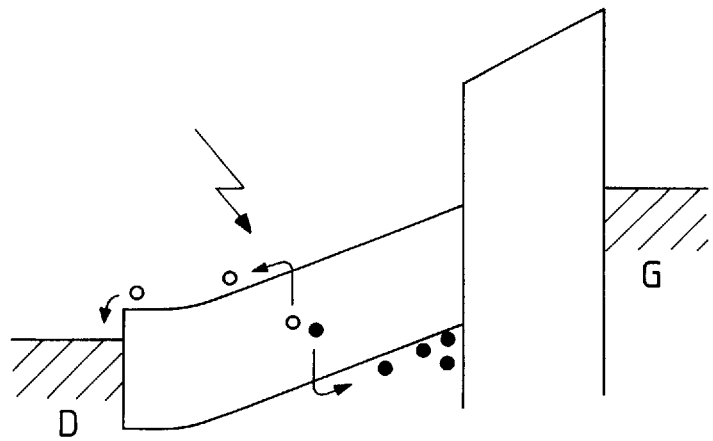

The operation during the image pickup (input) operation of the photoelectric conversion elements S11 to S33 used in this embodiment will be described below. FIGS. 5A and 5B are energy band diagrams showing the operations, in the refresh and photoelectric conversion modes, of the photoelectric conversion element of this embodiment, and show the states, in the direction of thickness, of the respective layers in FIG. 4B. In FIGS. 5A and 5B, a lower electrode (to be referred to as a G electrode hereinafter) 2 consists of ITO. An insulating layer 7 consists of SiN and prevents passage of both electrons and holes. The thickness of the insulating layer 7 is set to be at least 500 Å or more that can prevent migrations of electrons and holes due to the tunnel effect. A photoelectric conversion semiconductor layer 4 consists of an amorphous silicon (a-Si) hydrogenated intrinsic semiconductor i layer. An injection prevention layer 5 consists of an a-Si n layer, and prevents injection of holes into the photoelectric conversion semiconductor layer 4. An upper electrode (to be referred to as a D electrode hereinafter) 6 consists of Al. During the image pickup operation, the photoelectric conversion element operates in two different operation modes, i.e., the refresh mode and the photoelectric conversion mode depending on the way of application of a voltage to the D and G electrodes.

In the refresh mode shown in FIG. 5A, a negative potential with respect to the G electrode is applied to the D electrode, and holes indicated by full circles in the i layer 4 are attracted toward the D electrode by an electric field. At the same time, electrons indicated by open circles are injected into the i layer 4. At this time, some holes and electrons recombine and disappear in the n and i layers 5 and 4. When this state continues for a sufficiently long period of time, holes in the i layer 4 are swept out from the i layer 4.

In order to set the photoelectric conversion mode shown in FIG. 5B from this state, a positive potential with respect to the G electrode is applied to the D electrode. Upon application of the potential, electrons in the i layer 4 are instantaneously attracted toward the D electrode. However, holes are not attracted toward the i layer 4 since the n layer 5 serves as an injection prevention layer for them. When light is incident into the i layer 4 in this state, the light is absorbed, and electron-hole pairs are generated. The electrons are attracted toward the D electrode by an electric field, and holes move inside the i layer 4 and reach the interface between the i layer 4 and the insulating layer 7. However, since the holes cannot move into the insulating layer 7, they stay in the i layer 4. At this time, since the electrons move into the D electrode, and the holes move to the interface of the insulating layer 7 in the i layer 4, a current flows from the G electrode to maintain an electrically neutral state in the element. This current is proportional to the amount of incident light since it corresponds to the electron-hole pairs generated by the light. After the state of the photoelectric conversion mode in FIG. 5B is maintained for a given period of time, when the state of the refresh mode shown in FIG. 5A is set, the holes staying in the i layer 4 are attracted toward the D electrode, as described above, and a current corresponding to these holes flows at the same time. The number of holes corresponds to the total amount of incident light during the photoelectric conversion mode period. At this time, although a current corresponding to the number of electrons injected into the i layer 4 flows, the amount of the current can be subtracted upon detection since it is almost constant. More specifically, the photoelectric conversion element of this embodiment can output the amount of incident light in real time, and can also output the total amount of light incident during a given period. This is an outstanding feature of the photoelectric conversion element of this embodiment.

Figure 5C:
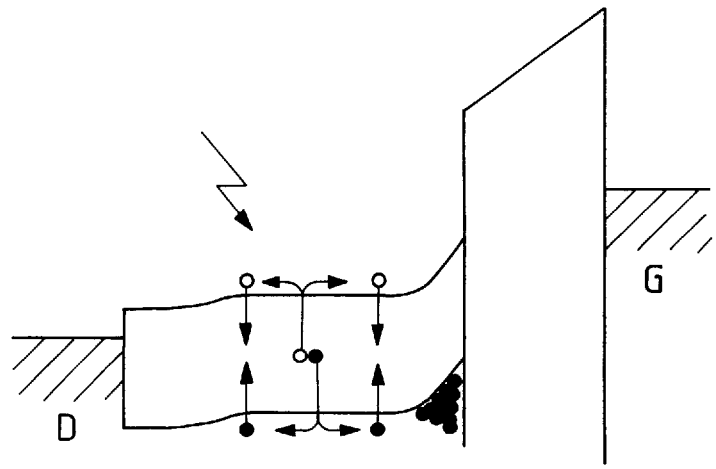

However, when the photoelectric conversion mode period is prolonged due to any cause, or when the illuminance of incident light is high, no current may flow despite the presence of incident light. This is because a large number of holes stay in the i layer 4 and reduce the electric field in the i layer 4, and the generated electrons cannot be attracted toward the D electrodes but recombine with the holes in the i layer 4, as shown in FIG. 5C. In this case, when the refresh mode is set again, the holes in the i layer 4 are swept out, and a current proportional to light can be obtained again in the photoelectric conversion mode.

In the above description, when holes in the i layer 4 are swept out in the refresh mode, it is ideal to sweep out all the holes. However, the same effect can be expected by sweeping out some holes, and the same current as described above can be obtained. More specifically, the state shown in FIG. 5C need only be prevented upon the next detection in the photoelectric conversion mode, and the potential of the D electrode with respect to the G electrode in the refresh mode, the period of the refresh mode, and the characteristics of the injection prevention layer of the n layer 5 need only be determined to achieve this. Furthermore, injection of electrons into the i layer 4 in the refresh mode is not a necessary condition, and the potential of the D electrode with respect to the G electrode is not limited to a negative potential. This is because when a large number of holes stay in the i layer 4, the electric field in the i layer is applied in the direction to attract holes toward the D electrode even when the potential of the D electrode is a positive potential with respect to the G electrode. In the characteristics of the injection prevention layer of the n layer 5, injection of electrons into the i layer 4 is not a necessary condition.

The operation during the image display (output) operation of the photoelectric conversion elements S11 to S33 used in this embodiment will be described below. During the image display operation, even when light is incident on the i layer 4, a charge in the i layer must not move. If a charge moves, the potential held for displaying information changes. In order to meet this requirement, a full electron mode shown in FIG. 6A and a full hole mode shown in FIG. 6B are used.

Figure 6A:
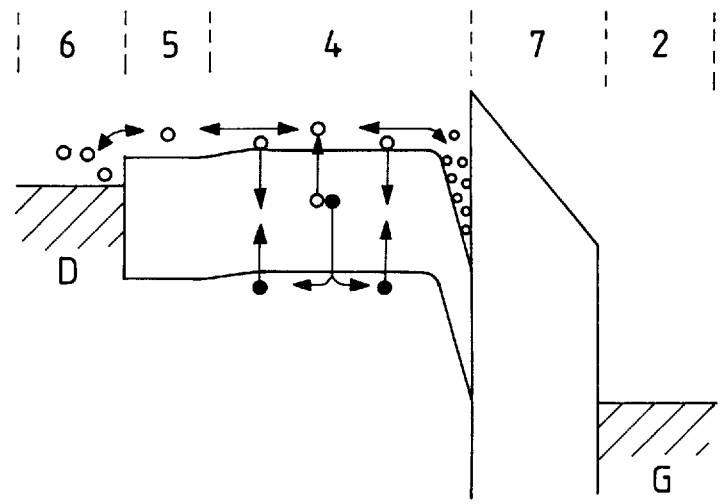

In the full electron mode shown in FIG. 6A, a negative potential with respect to the G electrode is applied to the D electrode. In this mode, after the same operation as in the refresh mode shown in FIG. 5A described above, when electrons are sufficiently injected into the i layer 4, an electric field is applied to only the insulating layer 7, but no electric field is applied to the i layer 4 since electrons are free to move. This state corresponds to the full electron mode shown in FIG. 6A. In the full electron mode shown in FIG. 6A, even when light is incident on the i layer 4, and electrons and holes are generated in the i layer 4, almost no holes move since no electric field is applied to the i layer 4. Since a large number of electrons are present in the i layer 4, the holes immediately recombine with the electrons and disappear. The same applies to a case wherein electrons or holes are thermally generated. More specifically, the electric fields in the respective layers do not change by incidence of light or heat, and an electric field is applied to only the insulating layer 7. Thus, the photoelectric conversion element exhibits the same characteristics as those of a capacitor formed by the dielectric film of only the insulating layer 7.

Figure 6B:
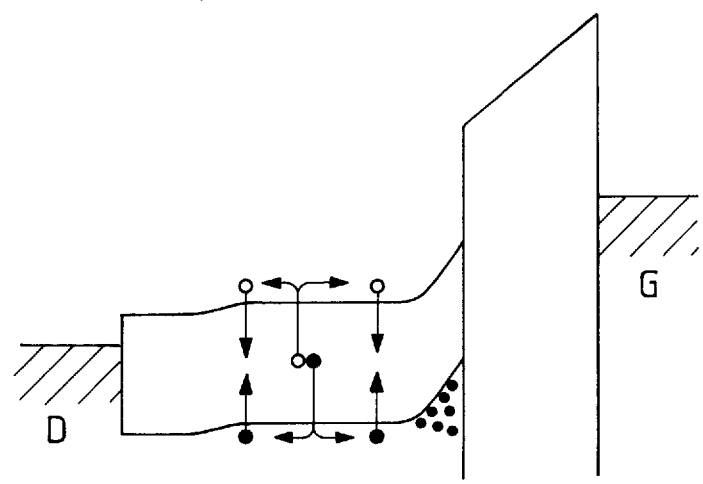

In the full hole mode shown in FIG. 6B, a positive potential with respect to the G electrode is applied to the D electrode. Since this state is the same as that in the photoelectric conversion mode shown in FIG. 5B described above, a charge corresponding to light moves, and the electric fields of the respective layers change during a given period. However, thereafter, as shown in FIG. 5C, a large number of holes generated by light or heat stay in the i layer 4, and application of the electric field finally stops due to the presence of these holes. This state corresponds to the full hole mode shown in FIG. 6C. In the full hole mode shown in FIG. 6B, even when light is incident on the i layer 4 and electrons and holes are generated, almost no electrons move since no electric field is applied to the i layer. In addition, since a large number of holes are present in the i layer, the electrons immediately recombine with holes and disappear. The same applies to a case wherein electrons or holes are thermally generated. More specifically, the electric fields in the respective layers do not change by incidence of light or heat, and an electric field is applied to only the insulating layer 7. Thus, the photoelectric conversion element exhibits substantially the same characteristics as those of a capacitor formed by the dielectric film of only the insulating layer 7.

More specifically, as shown in FIGS. 6A and 6B, the photoelectric conversion element according to this embodiment can exhibit substantially the same characteristics as those of a capacitor formed by the dielectric film of only the insulating layer 7 independently of the potentials of the D and G electrodes. Since the insulating layer 7 consists of SiN having stable characteristics free from any leakage current against incident of light or heat, the display potential remains the same during the image display operation, and a good display state can be assured. The difference between the full electron mode shown in FIG. 6A and the full hole mode shown in FIG. 6B is that the electric field is instantaneously stabilized in the full electron mode shown in FIG. 6A since electrons are positively injected from the D electrode, while stabilization of the electric field requires a certain period of time in the full hole mode shown in FIG. 6B. When the apparatus is to be operated at a low speed, no problem is posed in either of the modes shown in FIGS. 6A and 6B. However, when the apparatus is to be operated at a high speed, the full electron mode shown in FIG. 6A is advantageous and preferable. In this case, one of the G and D electrodes need only be controlled so that the potential of the G electrode becomes higher than that of the D electrode at any display potential.

As described above, the photoelectric conversion elements S11 to S33 in this embodiment can serve as photosensors which output photocurrents proportional to the amounts of incident light when they are refreshed periodically, and can also serve as good capacitors for holding the display potentials during an image display operation. Since the operation in the full electron mode can also attain a refresh operation, a refresh effect can be obtained during an image display operation, and the refresh operation need not always be positively executed.

Figure 7:
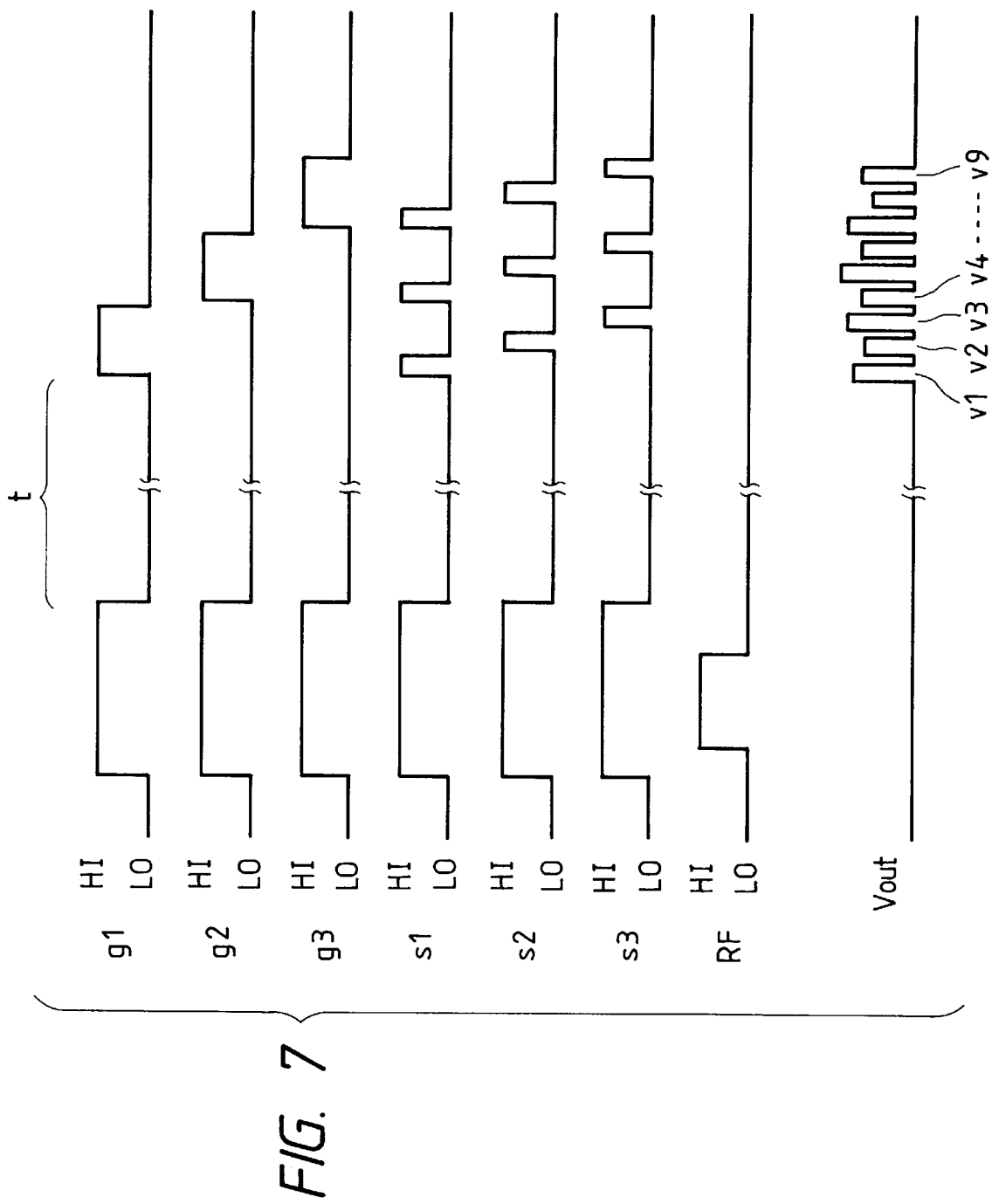
FIGS. 7 and 12 are timing charts for explaining the driving operations of the preferred embodiments of the image input/output apparatus of the present invention.

The image pickup operation of the solid-state image pickup/display apparatus of this embodiment will be described below with reference to FIGS. 3 and 7. FIG. 7 is a timing chart showing the operation of this embodiment. During an image pickup operation, a switch SWd in the liquid crystal drive circuit DR is kept OFF.

Initially, shift registers SR1 and SR2 apply Hi signals to control wiring lines g1 to g3 and s1 to s3. The transfer TFTs T11 to T33 and switches M1 to M3 are turned on and are electrically connected to each other, and the D electrodes of all the photoelectric conversion elements S11 to S33 are set at the GND potential (since the input terminal of an integration detector Amp is designed to be the GND potential). At the same time, the refresh control circuit RF outputs a Hi signal to turn on a switch SWg, and the G electrodes of all the photoelectric conversion elements S11 to S33 are set at a positive potential by the refresh power supply Vg. All the photoelectric conversion elements S11 to S33 are set in the refresh mode, and are refreshed. Then, the refresh control circuit RF outputs a Lo signal to turn on a switch SWs, and the G electrodes of all the photoelectric conversion elements S11 to S33 are set at a negative potential by the reading power supply Vs. All the photoelectric conversion elements S11 to S33 are set in the photoelectric conversion mode and are initialized. In this state, the shift registers SR1 and SR2 apply Lo signals to the control wiring lines g1 to g3 and s1 to s3. In response to these signals, the transfer TFTs T11 to T33 and the switches M1 to M3 are turned off, and the D electrodes of all the photoelectric conversion elements S11 to S33 hold potentials by their capacitor characteristics although they become open in a DC manner. In this state, image information light is incident on all the photoelectric conversion elements S11 to S33 for a predetermined reading period t. The potentials of the photoelectric conversion elements which received light change due to generated charges.

Then, when the shift register SR1 applies Hi control pulses to the control wiring line g1, outputs v1 to v3 are sequentially output via the transfer TFTs T11 to T13 and the switches M1 to M3 in response to control pulses applied from the shift register SR2 to the control wiring lines s1 to s3. Similarly, other optical signals are sequentially output under the control of the shift registers SR1 and SR2. With this operation, two-dimensional image information is obtained as outputs v1 to v9. A still image can be obtained by the above-mentioned operation. In order to obtain dynamic image information, the above-mentioned operation is repeated.

When an image display operation is to be performed, the switches M1 to M3 are turned off under the control of the shift register SR2, and the switch SWd in the liquid crystal drive circuit DR is turned on. The output from the refresh control circuit RF is set at Hi level to turn on the switch SWg so as to apply a positive potential to the G electrodes of all the photoelectric conversion elements S11 to S33. In this manner, the photoelectric conversion elements are controlled to serve as good capacitors in the full electron mode. Thereafter, a data control circuit CONT outputs display potentials on the respective signal wiring lines SIG, and the display potentials are transferred to the photoelectric conversion elements of the respective pixels in response to control pulses on the control wiring lines g1 to g3. The photoelectric conversion elements hold the potentials, and the liquid crystal display elements continuously display information during this interval. At this time, the common electrodes of the liquid crystal display elements are controlled by the data control circuit CONT to obtain good display characteristics.

In this embodiment, nine pixels are two-dimensionally disposed in a 3×3 matrix, and the image pickup and display operations are attained by simultaneously driving three pixels at three time-divisional timings. However, the present invention is not limited to this particular arrangement. For example, 2,000×2,000 pixels may be two-dimensionally disposed at a density of 5×5 pixels per 1-mm$^2$ area, thus realizing a 40 cm×40 cm image input/output apparatus. When this apparatus is combined with a computer and the output from a light pen is optically guided into the photoelectric conversion elements, the present invention can be applied to a CAD system with which a user can instruct an operation using the light pen while observing an image. In this case, a compact, lightweight CAD system with good operability can be provided as compared to that using a CRT or digitizer.

In this embodiment, the photoelectric conversion elements and the liquid crystal display elements are vertically stacked to use common electrodes and to simplify the manufacturing process, thus attaining cost reduction. However, the present invention is not limited to this arrangement. For example, the photoelectric conversion elements and the liquid crystal display elements may be horizontally juxtaposed. In this case as well, one or both of layers on the sides of electrodes may be simultaneously formed to simplify the manufacturing process.

In the above arrangement, the light output for a display operation is obtained from the upper surface side, and the light input for an image pickup operation is obtained from the lower surface side. However, the present invention is not limited to this detail. For example, "both the display and image pickup operations may be attained at the upper or lower surface side" or "the display operation may be attained at the lower surface side and the image pickup operation may be attained at the upper surface side". In this case, transparent, reflection, and diffusion electrode materials can be selectively used to form the respective electrodes in correspondence with each arrangement.

The display elements are not limited to liquid crystal elements. The present invention may be applied to any other elements as long as they attain a display operation on the basis of the potentials of the electrodes. The display device is not limited to a reflection type but may be a transmission type.

Since the capacitors utilizing the photoelectric conversion elements of the present invention can provide good capacitor characteristics even when light is incident during an image display (output) operation, various degrees of freedom can be obtained, as described above.

In this embodiment, the image pickup and display operations are separately described. However, when the image pickup and display operations are alternately repeated, such operations are equivalent to simultaneous execution of these operations in fact, and the apparatus of this embodiment can be widely applied as one that can simultaneously attain the image pickup and display operations.

Figure 8A:
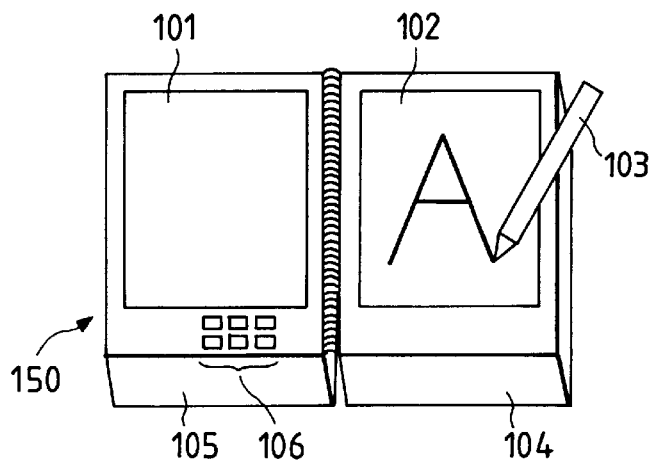
FIGS. 8A to 8C are perspective views for explaining one preferred embodiment of the image input/output apparatus according to the present invention.
Figure 8B:
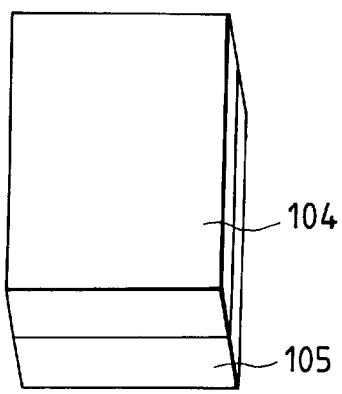
Figure 8C:
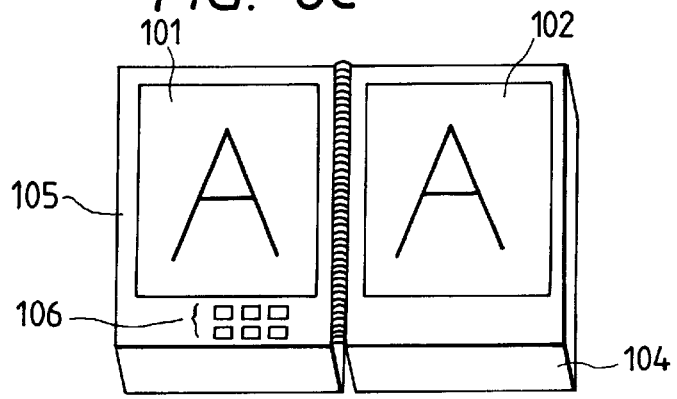

FIGS. 8A to 8C are perspective views of the overall image input/output apparatus to explain an image reading method according to another embodiment of the present invention.

In an image input/output apparatus 150 of this embodiment shown in FIG. 8A, a white recording plate 102 is disposed on the surface, opposing the display surface, of a cover (to be also referred to a lid hereinafter) 104 for protecting a display unit 101. FIG. 8A illustrates a state wherein a character is written on the white recording plate 102 using a character input pen 103. The recording plate 102 is not limited to the white recording plate 102, as long as desired information such as a character can be displayed and information such as a character can be read by an image sensor unit.

The display unit 101 arranged at the main body 105 side has a display function and an image sensor function. More specifically, the display unit serving as an image output unit and the image sensor unit serving as a portion of an image input unit are common. The positional relationship between the display unit and the image sensor unit is not particularly limited. For example, the arrangement shown in FIGS. 4A and 4B can be preferably used.

In this embodiment, the display unit uses a liquid crystal display, and the image sensor unit uses photoelectric conversion elements utilizing amorphous silicon.

An original reading light source (not shown) such as an LED for illuminating an original surface is disposed on the rear surface of the display unit 101 (also serves as the image sensor unit).

On an operation unit 106 shown in FIG. 8A, an operation system such as a power switch, a keyboard, and the like is arranged as needed. In addition, the main body incorporates an information processing unit for processing information to be processed by the image input/output apparatus, and information for operating the apparatus, a memory for storing various kinds of information, a power supply for driving the image input/output apparatus, and the like. However, an external power supply may be used to supply electric power, and the operation of the apparatus may be attained by commands input by an external apparatus. These specifications may be changed and modified as needed.

In this embodiment, for example, image information read by the image sensor unit is stored in the memory, and thereafter, is subjected to image processing by an image processing unit in the information processing unit. The image-processed information is displayed on the display unit 101 as needed. Alternatively, the information is displayed on the liquid crystal display after it is stored in the memory.

Upon operation of the operation unit 106 of the image input/output apparatus, the ON/OFF operation of the power supply, execution of the image reading and display operations, or the setting operation of a magnification upon enlargement of a displayed image can be performed as needed.

FIG. 8B shows the state wherein the cover 104 of the display unit is placed on the main body 105 after the state shown in FIG. 8A, i.e., the main body 105 is covered.

When a "reading" key on the operation unit 106 is depressed before the state shown in FIG. 8B, a character written on the recording plate 102 is read by the photoelectric conversion elements of the main body 105 side in the state shown in FIG. 8B.

FIG. 8C shows the state wherein the cover 104 of the display unit is separated from the main body 105 side after the state shown in FIG. 8B, i.e., the lid is opened. FIG. 8C illustrates the state wherein a character written on the recording plate 102 in the state shown in FIG. 8B is read by the photoelectric conversion elements of the main body 105 side, image processing of the read character is performed by the information processing unit, and the image-processed information is displayed on the liquid crystal display on the main body 105 side.

The operation of this embodiment will be described in detail below with reference to the flow chart in FIG. 9 and the perspective views shown in FIGS. 8A to 8C.

First, the power switch is turned on, and an image (character) to be read is written on the recording plate 102 using the image input pen 103. Then, the "reading" key on the operation unit 106 is depressed. The cover 104 of the display unit is closed, thereby reading the information written on the recording plate 102 (step (a)).

The read image is stored in the memory (step (b)), and is concurrently subjected to image processing for inverting the input data in the right-and-left direction (step (c)). The cover 104 of the display unit is opened, and a "display" key on the operation unit 106 is depressed. Then, the read image is displayed on the liquid crystal display (the display unit 101) (step (e)).

When an "enlargement" key on the operation unit 106 is depressed again in this state, steps (c) and (e) are executed again, and the character displayed on the liquid crystal display is enlarged to a ×2 size. When the "enlargement" key is depressed once again, steps (c) and (e) are executed again, and the displayed character is enlarged to a ×4 size. The image processing is not limited to a change in magnification, but may be image emphasis, color conversion, partial replacement of an image, movement of an image, and the like.

When a "memory" key on the operation unit 106 is depressed in this state, step (d) is executed, and the character with the ×4 size is stored in the memory. In this case, the stored information can be displayed on the liquid crystal display as needed. The memory preferably comprises an IC utilizing a semiconductor. Alternatively, a magnetic recording medium such as a floppy disk, an optical disk utilizing light, or other storage elements may be adopted.

In this embodiment, an image such as a character, picture, drawing, or the like handwritten on the recording plate 102 on the cover 104 of the display unit can be easily input to the image sensor unit by opening/closing the cover 104 of the display unit.

When the recording plate 102 comprises, e.g., a white board, an image input on the recording plate can be easily rewritten since a normally used felt pen can be used. Furthermore, when a color image sensor is used, a color image can be input using color felt pens. Of course, when an original such as a photograph is attached on the recording plate 102, information such as a photograph can also be input.

The image input/output apparatus of the present invention is not limited to the one described in this embodiment. More specifically, in an image input apparatus which comprises reading means for inputting an image as a two-dimensional image input unit and display means for outputting an image as a two-dimensional image output unit, which are disposed on a single surface, image processing means for processing an image input by the reading means, and a cover for protecting the surface on which the reading means and the display means are disposed, a display recording plate such as a white recording plate may be disposed on one surface of the protection cover, which faces the surface on which the reading means and the display means are arranged.

Figure 15:
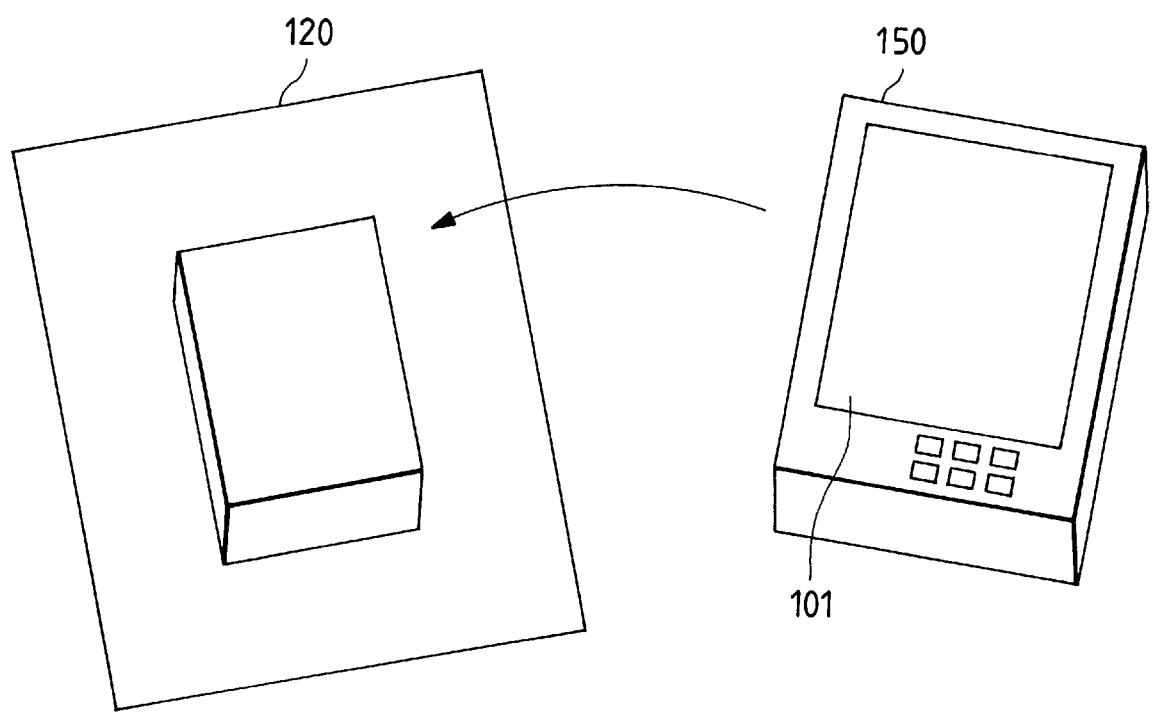
FIG. 15 is a perspective view for explaining the image input/output apparatus of the present invention.

Even when no cover is arranged, the display unit 101 may be set to face an original 120, as shown in FIG. 15.

The reading means as a two-dimensional image input unit is not limited to an amorphous silicon image sensor which allows the manufacture of a large-screen sensor with low cost, but may comprise a crystallite or polycrystalline silicon image sensor which allows high-speed reading, or an infrared or ultraviolet sensor which allows detection using an infrared or ultraviolet light source as a light source.

Similarly, the display means as a two-dimensional image output unit preferably comprises a liquid crystal display since a large-screen display can be manufactured with relatively low cost and required elements can be formed by an arrangement similar to that of the image sensor. However, the present invention is not limited to the liquid crystal display. For example, a flat-panel CRT which allows a display with higher definition, a plasma display which allows a brighter display, or the like may be used.

This embodiment has no recording means such as a printer. However, recording means such as a printer can be easily arranged in the image input/output apparatus of the present invention.

Figure 10:
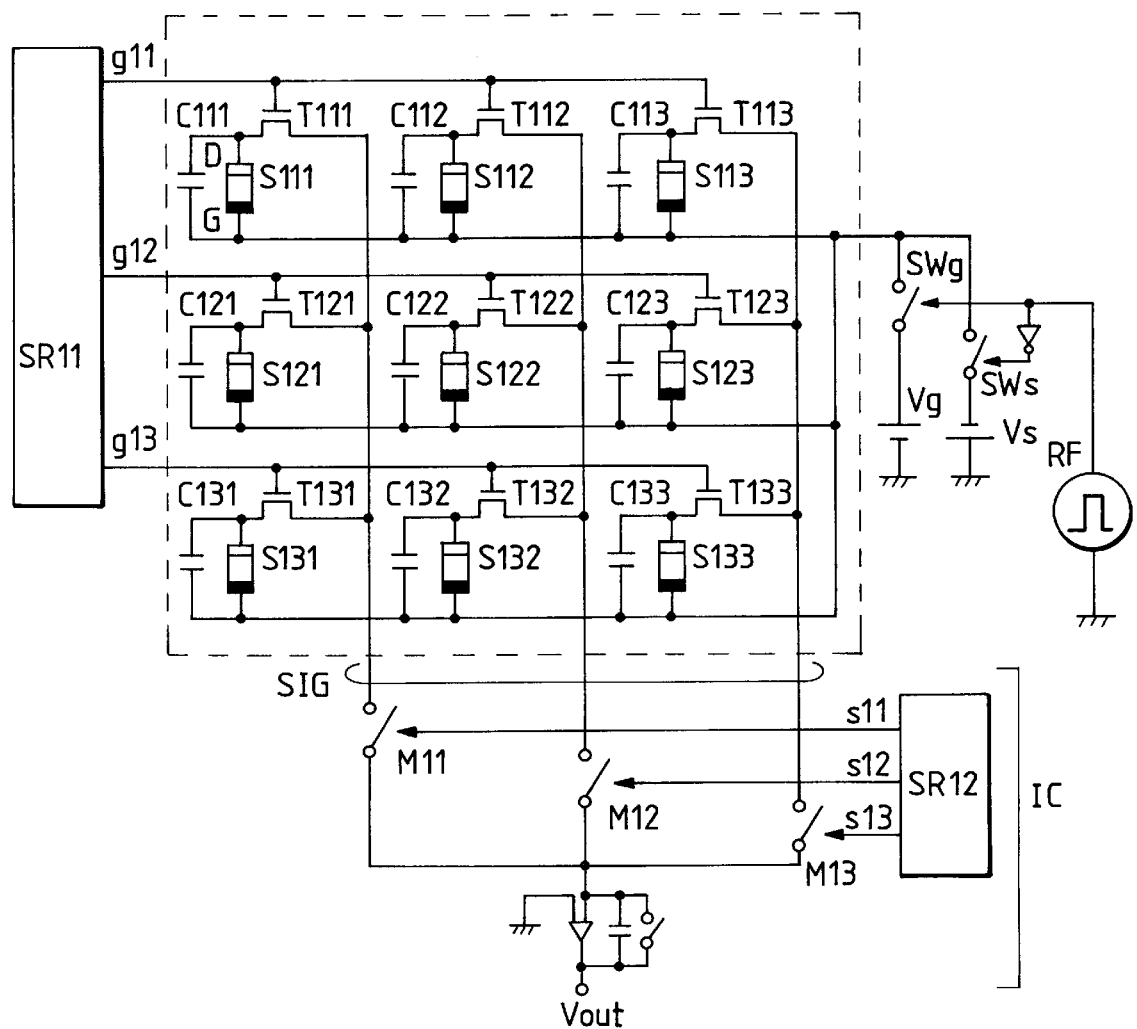
Figure 11A:
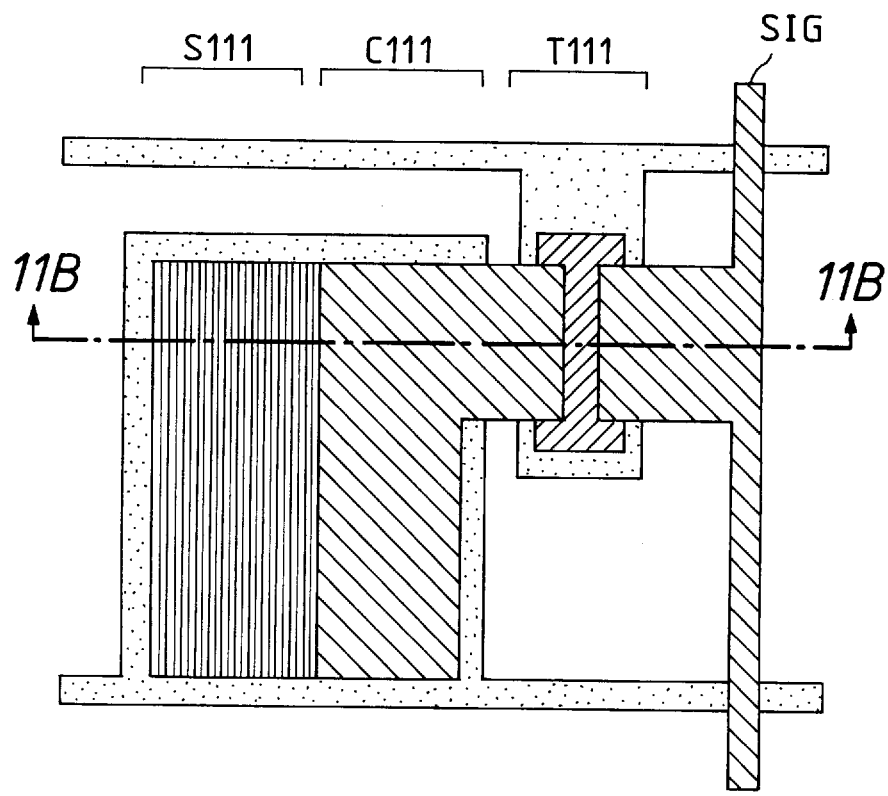
Figure 11B:
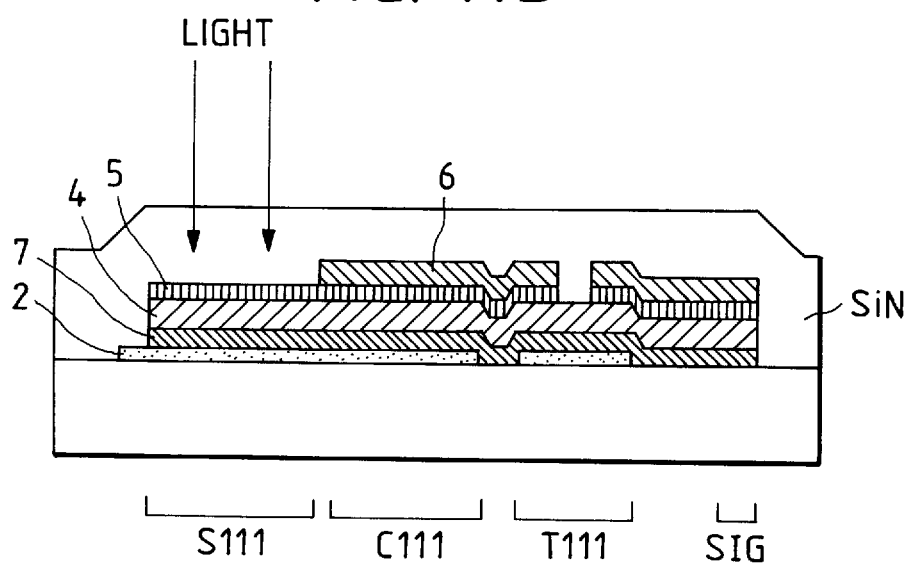

FIG. 10 is a schematic circuit diagram showing the entire image input unit in an image input/output apparatus according to still another embodiment of the present invention, FIG. 11A is a plan view of constituting elements corresponding to one pixel in this embodiment, and FIG. 11B is a sectional view taken along a line 11B—11B in FIG. 11A. The circuit shown in FIG. 10 includes photoelectric conversion elements S111 to S133 each having a lower electrode G and an upper electrode D. The circuit shown in FIG. 10 also includes capacitors C111 to C133, and transfer TFTs T111 to T133. A reading power supply Vs and a refresh power supply Vg are connected to the G electrodes of the photoelectric conversion elements S111 to S133 via switches SWs and SWg, respectively. The switch SWs is connected to a refresh control circuit RF via an inverter, and the switch SWg is directly connected to the circuit RF. These switches are controlled by the circuit RF, so that the switch SWg is turned on during the refresh period, and the switch SWs is turned on during other periods. One pixel is constituted by a photoelectric conversion element, a liquid crystal display element, and a TFT, and a signal output from each pixel is connected to a detection integrated circuit IC via a signal wiring line SIG. In a photoelectric conversion device of this embodiment, a total of nine pixels are divided into three blocks, and the outputs from three pixels of each block are simultaneously transferred. These outputs are sequentially converted into output signals by the detection integrated circuit via the signal wiring lines, and the output signals are output. The pixels are two-dimensionally arranged by arranging three pixels in one block in the horizontal direction in FIG. 10 and arranging the three blocks in turn in the vertical direction in FIG. 10.

A portion surrounded by a broken line in FIG. 10 is formed on a single large-area insulating substrate. FIG. 11A is a plan view of a portion corresponding to the first pixel in the portion surrounded by the broken line in FIG. 10. The pixel shown in FIG. 11A includes the photoelectric conversion element S111, the TFT T111, the capacitor C111, and the signal wiring line SIG. In this embodiment, the capacitor C111 and the photoelectric conversion element S111 are not specially element-isolated, and the capacitor C111 is formed by increasing the area of the electrode of the photoelectric conversion element S111. This structure can be realized since the photoelectric conversion element and the capacitor have the same layer structure, and is the characteristic feature of this embodiment. FIG. 11B is a sectional view of the portion taken along a broken line 11B—11B in FIG. 11A. A passivation silicon nitride film SiN is formed on the upper portion of the pixel. Original illumination light is irradiated from the rear surface side of the photoelectric conversion element portion onto an original, and light reflected by the original is incident on the photoelectric conversion element. The layer structure shown in FIG. 11B includes a lower electrode 2 consisting of, e.g., Cr, an insulating layer 7 consisting of, e.g., SiO, SiN, or the like, an i-type photoelectric conversion semiconductor layer 4, an n-type hole injection prevention layer 5, and an upper electrode 6. Note that the photoelectric conversion element used in this embodiment is based on the same operation principle as that described above with reference to FIGS. 5A to 5C.

Figure 12:
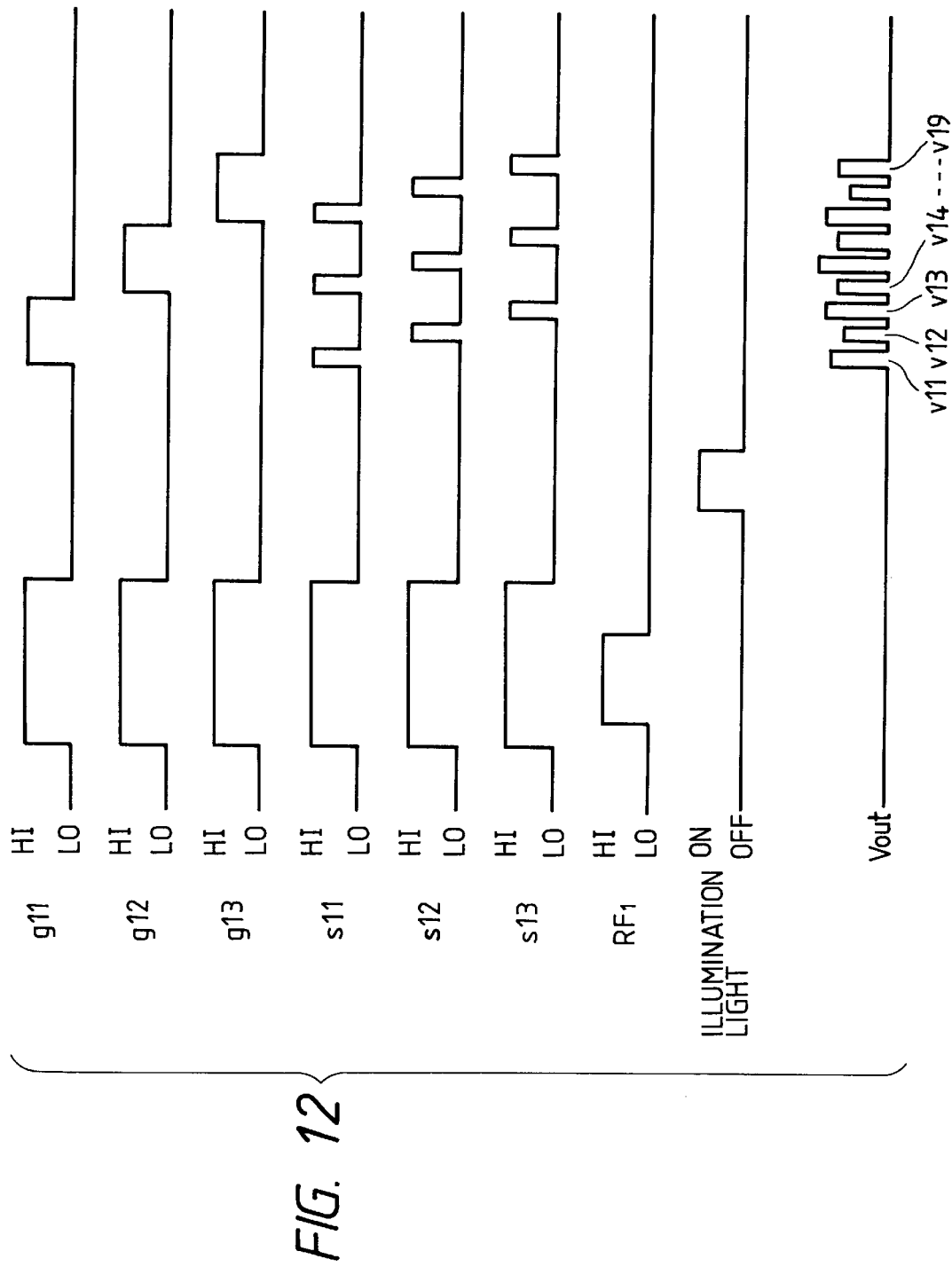

The operation of the photoelectric conversion device of this embodiment will be described below with reference to FIGS. 10 and 12. FIG. 12 is a timing chart showing the operation of this embodiment.

Initially, shift registers SR11 and SR12 apply Hi signals to control wiring lines g11 to g13 and s11 to s13. The transfer TFTs T111 to T133 and switches M11 to M13 are turned on and are electrically connected to each other, and the D electrodes of all the photoelectric conversion elements S111 to S133 are set at the GND potential (since the input terminal of an integration detector Amp is designed to be the GND potential). At the same time, a refresh control circuit $RF_1$ outputs a Hi signal to turn on a switch SWg, and the G electrodes of all the photoelectric conversion elements S111 to S133 are set at a positive potential by the refresh power supply Vg. All the photoelectric conversion elements S111 to S133 are set in the refresh mode, and are refreshed. Then, the refresh control circuit $RF_1$ outputs a Lo signal to turn on a switch SWs, and the G electrodes of all the photoelectric conversion elements S111 to S133 are set at a negative potential by the reading power supply Vs. All the photoelectric conversion elements S111 to S133 are set in the photoelectric conversion mode and the capacitors C111 to C133 are initialized. In this state, the shift registers SR11 and SR12 apply Lo signals to the control wiring lines g11 to g13 and s11 to s13. In response to these signals, the transfer TFTs T111 to T133 and the switches M11 to M13 are turned off, and the capacitors C111 to C133 hold potentials by their capacitor characteristics although the D electrodes of all the photoelectric conversion elements S111 to S133 become open in a DC manner. However, since no illumination light is incident at this time, no light is incident on the photoelectric conversion elements S111 to S133, and no photocurrents flow. In this state, if illumination light is output as light pulses or continuous light, and is irradiated onto an original, light reflected by the original is incident on the photoelectric conversion elements S111 to S133. This light includes information of an image on the original. Photocurrents which flow in response to this light are stored in the capacitors C111 to C133 as charges, and are held after the irradiation of the incident light. The shift register SR11 applies Hi control pulses to the control wiring line g11, and signals v11 to v13 are sequentially output via the transfer TFTs T111 to T113 and the switches M11 to M13 in response to control pulses applied from the shift register SR12 to the control wiring lines s11 to s13. Similarly, other optical signals are output under the control of the shift registers SR11 and SR12. Thus, two-dimensional information on the original is obtained as signals v11 to v19. A still image can be obtained by the above-mentioned operation. In order to obtain dynamic image information, the above-mentioned operation is repeated.

In this embodiment, since the G electrodes of the photoelectric conversion elements are connected to common wiring lines, and the common wiring lines are controlled to be at the potentials of the refresh power supply Vg and the reading power supply Vs via the switches SWs and SWg, all the photoelectric conversion elements can be simultaneously switched between the refresh mode and the photoelectric conversion mode. For this reason, optical outputs can be obtained using one TFT per pixel without requiring any complicated control.

In this embodiment, nine pixels are two-dimensionally disposed in a 3×3 matrix, and the image pickup and display operations are attained by simultaneously driving three pixels each at three time-divisional timings. However, the present invention is not limited to this arrangement. For example, 2,000×2,000 pixels may be two-dimensionally disposed at a density of 5×5 pixels per 1-mm$^2$ area, thus realizing a 40 cm×40 cm image input unit.

Figure 13:
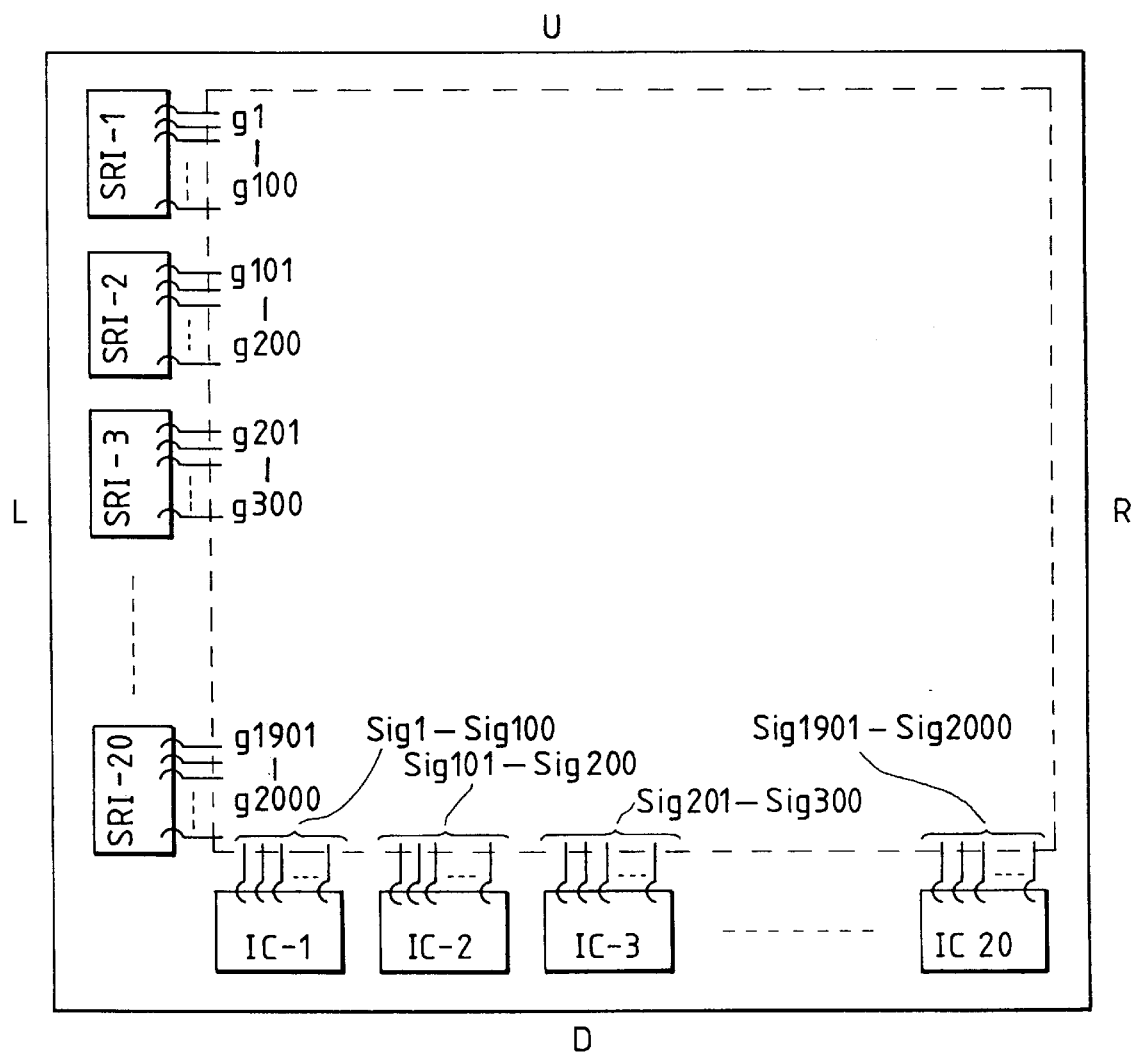
FIGS. 13 and 14 are plan views for explaining the preferred embodiments of the overall arrangements of the image input/output apparatus of the present invention.
Figure 14:
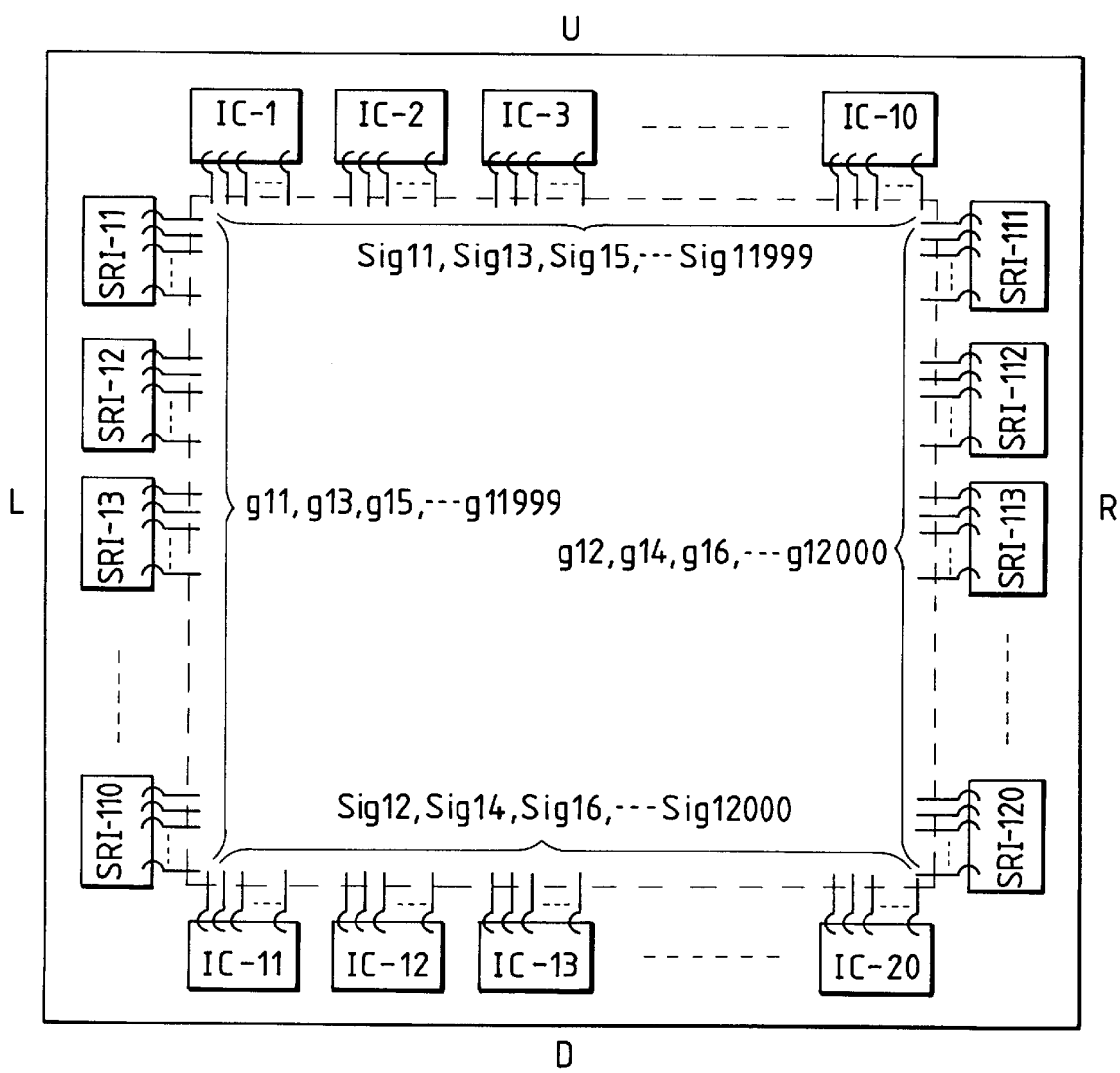

FIGS. 13 and 14 show the mounting states of an image input/output apparatus having 2,000×2,000 pixels. For example, when an image input/output apparatus having 2,000×2,000 pixels is to be realized, the number of elements surrounded by the broken line in FIG. 10 need only be increased in both the vertical and horizontal directions. In this case, the number of control wiring lines is increased to 2,000 (lines g11 to g12000), and the number of signal wiring lines SIG is also increased to 2,000 (lines sig11 to sig12000). The shift register SR11 and the detection integrated circuit IC must have a large scale since they must perform control and processing of 2,000 lines. If the shift register and the integrated circuit are realized by one-chip elements, the scale of one chip becomes very large, and such an element is disadvantageous in terms of yield and cost in the manufacture. Thus, as the shift register SR11, one chip is formed per 100 stages, and a total of 20 shift registers (SR11-1 to SR11-20) are used. Also, as the detection integrated circuit, one chip is formed per 100 processing circuits, and a total of 20 integrated circuits (IC1 to IC20) are used.

In FIG. 13, 20 chips (SR11-1 to SR11-20) are mounted at the left side (L), 20 chips are mounted at the lower side (D), and 100 control wiring lines and 100 signal lines per chip are connected to each chip by wire bonding. A portion surrounded by a broken line in FIG. 13 corresponds to the portion surrounded by the broken line in FIG. 10. Also, connections to an external circuit are not shown in FIG. 13. Furthermore, the elements SWg, SWs, Vg, Vs, RF, and the like are not shown in FIG. 13. Twenty outputs (Vout) are obtained from the detection integrated circuits IC1 to IC20. These outputs may be connected to a single line via a switch or the like, or the 20 outputs may be directly output and may be subjected to parallel processing.

FIG. 14 shows still another embodiment. In FIG. 14, 10 chips (SR11-1 to SR11-10) are mounted at the left side (L), 10 chips (SR11-11 to SR11-20) are mounted at the right side (R), 10 chips (IC1 to IC10) are mounted at the upper side (U), and 10 chips (IC11 to IC20) are mounted at the lower side (D). In this arrangement, since 1,000 wiring lines each are distributed to the upper, lower, left, and right sides (U, D, L, R), the wiring density of each side is further reduced, and the wire bonding density of each side is also reduced, thus further improving the yield. The wiring lines are distributed in such a manner that lines g11, g13, g15, . . . , g1999 are distributed to the left side (L), and lines g12, g14, g16, . . . , g12000 are distributed to the right side (R). That is, the odd-numbered control lines are distributed to the left side (L), and even-numbered control lines are distributed to the right side (R). With this arrangement, since the wiring lines are extended and connected at equal intervals, they can be prevented from being concentrated at high density, thus further improving the yield. Similarly, the odd- and even-numbered wiring lines can be similarly distributed to the upper side (U) and the lower side (D). Although not shown, as still another embodiment, the wiring lines may be distributed in such a manner that lines g11 to g1100, g1201 to g1300, . . . , g1801 to 1900 are distributed to the left side (L), and lines g1101 to g1200, g1301 to g1400, . . . , g1901 to g12000 are distributed to the right side (R). More specifically, continuous control lines may be distributed to each chip, and sets of continuous control lines are alternately distributed to the left and right sides (L, R). With this arrangement, one chip can be continuously controlled, and the driving timings of the apparatus can be easily determined. In addition, since the circuit need not be made complicated, IC chips with lower cost can be used. Similarly, the wiring lines can be continuously distributed in units of chips to the upper side (U) and the lower side (D), and a circuit with lower cost can be used since continuous processing can be realized.

In both FIGS. 13 and 14, after the circuit surrounded by the broken line is formed on a single board, chips may be mounted on the board, or a circuit board corresponding to the portion surrounded by the broken line and chips may be mounted on another large board. Alternatively, chips may be mounted on a flexible board, and the flexible board may be adhered and connected to the circuit board corresponding to the portion surrounded by the broken line.

Conventionally, it is difficult to manufacture a large-area image input unit having a very large number of pixels by utilizing photosensors formed via complex processes. However, the number of manufacturing processes for the image input unit according to the present invention is small since the respective elements can be simultaneously formed by utilizing common films in simple processes. Therefore, a large-area, high-performance image input unit can be manufactured with high yield and low cost. Since a capacitor and a photoelectric conversion element can be arranged in a single element, the number of elements can be halved in practice, thus further improving the yield.

As can be seen from the above description, the photoelectric conversion element of the present invention is not limited to the ones described in the above embodiments. More specifically, the photoelectric conversion element need only comprise a first electrode layer, an insulating layer for preventing migration of holes and electrons, a photoelectric conversion semiconductor layer, and a second electrode layer, and an injection prevention layer for preventing injection of holes into the photoelectric conversion layer need only be present between the second electrode layer and the photoelectric conversion layer. For example, the injection prevention layer may comprise a Shottky barrier layer formed by the difference between the work functions of a semiconductor and an electrode. In the above description, holes and electrons may be reversed. For example, the injection prevention layer may comprise a p-type layer. In this case, when other arrangement portions are constituted by inverting the voltages and electric fields to be applied, the same operations as described above can be attained. Furthermore, the photoelectric conversion semiconductor layer need only have a photoelectric conversion function of generating electron-hole pairs upon incidence of light. The layer structure of the photoelectric conversion semiconductor layer is not limited to a single-layer structure but may be a multi-layered structure. Also, the characteristics of the photoelectric conversion semiconductor layer may continuously change.

Similarly, the TFT need only comprise a gate electrode, a gate insulating film, a semiconductor layer which can form a channel, an ohmic contact layer, and a main electrode. For example, the ohmic contact layer may comprise a p-type layer. In this case, the control voltage for the gate electrode may be inverted, and holes may be used as carriers.

Furthermore, the entire portion of the insulating substrate need not consist of an insulating material. For example, an insulating material may be deposited on a conductor or a semiconductor. In this case, the deposition order may be reversed.

Similarly, the capacitor need only comprise a lower electrode, an intermediate layer including an insulating layer, and an upper electrode. For example, even when the capacitor is not specially isolated from the photoelectric conversion element or the TFT, the capacitor may commonly use the electrode portions of the respective elements.

Since the photoelectric conversion element itself has a function of storing a charge, an integral value of light information for a predetermined period of time can be obtained without arranging any special capacitor.

Of course, the present invention is not limited to the above description, and various changes and modifications may be made within the spirit and scope of the invention.

As described above, the present invention can provide a solid-state image pickup/display apparatus which need not have any complicated structure for shielding light, has high degree of freedom of design, has good display characteristics and image pickup characteristics, and can be easily manufactured with low cost, since good capacitor characteristics can be maintained, the hold potential is kept unchanged, and a displayed image is not disturbed even when light is incident on a photoelectric conversion element during an image display operation.

Since the photoelectric conversion element in the solid-state image pickup/display apparatus of the present invention can detect the amount of incident light by only one injection prevention layer, can easily optimize processes, can improve the yield, and can reduce the manufacturing cost, a low-cost photoelectric conversion device with a high S/N ratio can be manufactured. Since a first electrode layer, an insulating layer, and a photoelectric conversion semiconductor layer do not utilize the tunnel effect or Shottky barrier, electrode materials can be freely selected, and the thickness of the insulating layer and other control parameters have high degrees of freedom. The photoelectric conversion element has good matching characteristics with a switch element such as a thin film field effect transistor (TFT) and/or a capacitor element to be simultaneously formed. In addition, these elements have the same film structure. For this reason, these elements can be simultaneously formed. Furthermore, since the important film structure of both the photoelectric conversion element and the TFT can be simultaneously formed in a single vacuum state, the photoelectric conversion device can have a higher S/N ratio and lower cost.

An image input/output apparatus of the present invention comprises a device having functions of a two-dimensional image input unit and a two-dimensional image output unit which are disposed on a single surface, an image processing unit for processing an image signal input from the image input unit, and a cover for protecting the surface on which the two-dimensional image input unit and the two-dimensional image output unit are disposed, and a display plate such as a white recording player is disposed on one surface of the protection cover, which faces the surface on which the two-dimensional image input unit and the two-dimensional image output unit are disposed. For this reason, the entire apparatus can be rendered compact, and its cost can be reduced.

Since the recording plate or the like is disposed on one surface of the cover for an image input surface, a character or the like written on the recording plate or the like can be automatically read by covering the image input surface, and the read image information can be displayed on an image output surface in real time, thus improving operability.

When the two-dimensional image input unit and the two-dimensional image output unit comprise those that can process a color image, a color image written on the recording plate or the like can be directly displayed on the image output surface, thus realizing a high-performance image input/output apparatus.

As can be seen from the above description, since the photoelectric conversion element and the TFT can be simultaneously formed in a single process, the TFT for driving a liquid crystal display for displaying an image and the photoelectric conversion element can be formed on a single substrate. For this reason, the cost of the entire image input/output apparatus can be further reduced.

What is claimed is:

1. An image input/output apparatus comprising:
an image input unit having a photoelectric conversion element; and
an image output unit,
wherein said photoelectric conversion element includes at least a first electrode formed on a first substrate, an insulating layer for preventing a passing therethrough of a carrier of a first conductivity type and a carrier of a second conductivity type different from the first conductivity type, a semiconductor photoelectric conversion layer, a second electrode, and an injection prevention layer provided between said second electrode and said semiconductor photoelectric conversion layer for preventing an injection of the carrier of the first conductivity type into said semiconductor photoelectric conversion layer, and wherein said insulating layer, said semiconductor photoelectric conversion layer and said injection preventing layer are arranged between said first and second electrodes; and
said image output unit has a display element comprising said second electrode as one electrode and a counter-electrode arranged opposite to said second electrode, wherein said counter-electrode is provided on a second substrate arranged opposite to said first substrate.

2. An apparatus according to claim 1, further comprising a switch element on said first substrate.

3. An apparatus according to claim 1, further comprising a switch element on said first substrate in correspondence with said photoelectric conversion element.

4. An apparatus according to claim 1, further comprising:
a liquid crystal layer provided in a space sandwiched between said second electrode and said counter-electrode.

5. An apparatus according to claim 2, wherein said switch element comprises a thin film transistor.

6. An apparatus according to claim 3, wherein said switch element comprises a thin film transistor.

7. An apparatus according to claim 5, wherein said thin film transistor comprises a gate electrode layer, a gate insulating layer, a semiconductor layer, first and second main electrode layers formed on said semiconductor layer to be separated by a given interval, and an ohmic contact layer formed between said first and second main electrode layers, and said semiconductor layer.

8. An apparatus according to claim 6, wherein said thin film transistor comprises a gate electrode layer, a gate insulating layer, a semiconductor layer, first and second main electrode layers formed on said semiconductor layer to be separated by a given interval, and an ohmic contact layer formed between said first and second main electrode layers, and said semiconductor layer.

9. An apparatus according to claim 1, further comprising a thin film transistor serving as a switch element on said first substrate, wherein said thin film transistor comprises a gate electrode layer, a gate insulating layer, a semiconductor layer, first and second main electrode layers formed on said semiconductor layer to be separated by a given interval, and an ohmic contact layer formed between said first and second main electrode layers, and said semiconductor layer, and
wherein said first electrode and said gate electrode layer of said thin film transistor consist of a common film, said insulating layer and said gate insulating layer of said thin film transistor, which is formed on said gate electrode layer consist of a second common film, said semiconductor photoelectric conversion layer and said semiconductor layer of said thin film transistor consist of a third common film, which is formed on said gate insulating layer, said second electrode and said first and second maim electrode layers of said thin film transistor consist of a fourth common film, which are formed on said semiconductor layer via said ohmic contact layer to be separated from each other by a given interval, and said injection prevention layer and said ohmic contact layer consist of a fifth common film.

10. An apparatus according to claim 1, further comprising a circuit for performing a driving operation during an image display operation so that carriers of the second conductivity type are filled in said semiconductor photoelectric conversion layer to hold a display potential in one of said first and second electrode.

11. An apparatus according to claim 1, further comprising a circuit for performing a driving operation during an image pickup operation so that carriers of the first conductivity type generated in response to light incident on said semiconductor photoelectric conversion layer stay in said semiconductor photoelectric conversion layer, an electric field is applied to said photoelectric conversion element in a direction to attract carriers of the second conductivity type toward said second electrode, and the carriers of the first conductivity type stored in said semiconductor photoelectric conversion layer or the carriers of the second conductivity type attracted toward said second electrode are detected as an optical signal.

12. An apparatus according to claim 1, further comprising a circuit in which a pixel is formed by said photoelectric conversion element and said display element, a plurality of pixels are arranged one-dimensionally or two-dimensionally, switch elements are connected in units of pixels, the pixels are divided into a plurality of blocks, and the switch elements are operated in units of blocks to attain an image display operation and a detection operation of an optical signal.

13. An apparatus according to claim 1, wherein said image input unit and said image output unit are constituted by a single unit.

14. An apparatus according to claim 1, further comprising a cover for covering said image input unit and said image output unit.

15. An apparatus according to claim 14, wherein a surface, facing said image input unit and said image output unit, of said cover has a recording surface.

16. An apparatus according to claim 1, further comprising a memory for storing image data input by said image input unit.

17. An apparatus according to claim 1, further comprising an image processing circuit for performing image processing on the basis of image data input by said image input unit.

18. An apparatus according to claim 17, further comprising a memory for storing image data processed by said image processing circuit.

19. An apparatus according to claim 1, further comprising an illumination device for illuminating an original, an image on which is to be input by said image input unit.

20. An image input/output apparatus comprising:
   an input and output unit wherein an image input unit for image input having a photoelectric conversion element and an image output unit are integrated at one side; and
   a cover capable of moving in a direction opposing said image input and output unit to cover said image input and output unit, and having a recording surface positioned corresponding to said image input and output unit by the movement of said cover in the opposing direction.

21. An apparatus according to claim 20, further comprising a memory for storing image data input by said image input unit.

22. An apparatus according to claim 20, further comprising an image processing circuit for performing image processing on the basis of image data input by said image input unit.

23. An apparatus according to claim 20, further comprising a memory for storing image data processed by said image processing circuit.

24. An apparatus according to claim 20, further comprising an illumination device for illuminating an original, an image on which is to be input by said image input unit.

25. An image input/output apparatus comprising:
   an image input and output unit including at least a first electrode formed on a first substrate, an insulating layer for preventing a carrier of a first conductivity type and a carrier of a second conductivity type different from the first conductivity type from passing therethrough, a semiconductor photoelectric conversion layer, a second electrode, and a carrier injection preventing layer provided between said second electrode and said semiconductor photoelectric conversion layer for preventing an injection of the carrier of the first conductivity type into said semiconductor photoelectric conversion layer, and further having a photoelectric conversion element comprising said insulating layer, said semiconductor photoelectric conversion layer and said injection prevention layer laminated between said first and second electrodes; and
   an image output unit having a display element comprising said second electrode as one electrode and a counter-electrode arranged opposite to said second electrode, wherein said counter-electrode is provided on a second substrate provided opposite to said first substrate.

26. An apparatus according to claim 25, further comprising a liquid crystal provided in a space sandwiched between said second electrode and said counter-electrode.

* * * * *

UNITED STATES PATENT AND TRADEMARK OFFICE
CERTIFICATE OF CORRECTION

PATENT NO. : 5,812,109
DATED : September 22, 1998
INVENTOR(S) : NORIYUKI KAIFU ET AL.

It is certified that error appears in the above-identified patent and that said Letters Patent is hereby corrected as shown below:

ON COVER PAGE AT [56] REFERENCES CITED, FOREIGN PATENT DOCUMENTS

"4282609" should read --4-282609--; and
"5244346" should read --5-244346--.

COLUMN 6

Line 32, "an photoelectric" should read --a photoelectric--.

COLUMN 20

Line 56, "maim" should read --main--;
Line 67, "electrode." should read --electrodes.--.

Signed and Sealed this

Twenty-fourth Day of August, 1999

Attest:

Q. TODD DICKINSON

*Attesting Officer*    *Acting Commissioner of Patents and Trademarks*